(12) United States Patent
Quach et al.

(10) Patent No.: US 7,741,585 B2
(45) Date of Patent: *Jun. 22, 2010

(54) INTEGRATED THERMAL UNIT HAVING A SHUTTLE WITH TWO-AXIS MOVEMENT

(75) Inventors: David H. Quach, San Jose, CA (US); Martin Jeff Salinas, San Jose, CA (US)

(73) Assignee: Sokudo Co., Ltd., Kyoto (JP)

( * ) Notice: Subject to any disclaimer, the term of this patent is extended or adjusted under 35 U.S.C. 154(b) by 254 days.

This patent is subject to a terminal disclaimer.

(21) Appl. No.: 11/929,650

(22) Filed: Oct. 30, 2007

(65) Prior Publication Data

US 2008/0047950 A1    Feb. 28, 2008

Related U.S. Application Data

(63) Continuation of application No. 11/174,781, filed on Jul. 5, 2005, now Pat. No. 7,297,906.

(60) Provisional application No. 60/639,109, filed on Dec. 22, 2004.

(51) Int. Cl.
 *H05B 3/68* (2006.01)
 *C23C 16/00* (2006.01)
(52) U.S. Cl. .................. 219/444.1; 118/724
(58) Field of Classification Search ........... 219/443.1, 219/444.1, 390; 118/724, 725, 728, 729; 414/935–941
See application file for complete search history.

(56) References Cited

U.S. PATENT DOCUMENTS

| | | | |
|---|---|---|---|
| 4,718,975 A | 1/1988 | Bowling et al. | |
| 4,985,722 A | 1/1991 | Ushijima et al. | |
| 5,252,807 A * | 10/1993 | Chizinsky | 219/390 |
| 5,651,823 A | 7/1997 | Parodi et al. | |
| 6,097,005 A * | 8/2000 | Akimoto | 219/444.1 |
| 6,467,976 B2 | 10/2002 | Matsuyama et al. | |
| 6,499,777 B1 | 12/2002 | Wang | |
| 6,515,731 B1 | 2/2003 | Aimoto et al. | |
| 6,518,548 B2 | 2/2003 | Sugaya et al. | |
| 6,624,393 B2 | 9/2003 | Howell et al. | |
| 6,639,189 B2 | 10/2003 | Ramanan et al. | |
| 6,717,115 B1 | 4/2004 | Pfahnl et al. | |
| 6,814,507 B2 | 11/2004 | Inagaki | |
| 7,282,675 B2 | 10/2007 | Quach et al. | |
| 7,297,906 B2 | 11/2007 | Quach et al. | |

OTHER PUBLICATIONS

Office Action for U.S. Appl. No. 11/174,781 (Sep. 11, 2006).
Office Action for U.S. Appl. No. 11/174,782 (Sep. 11, 2006).
International Search Report and Written Opinion of PCT Application No. PCT/US05/46637, dated Feb. 22, 2008.

* cited by examiner

*Primary Examiner*—Sang Y Paik
(74) *Attorney, Agent, or Firm*—Townsend and Townsend and Crew, LLP

(57) ABSTRACT

An integrated thermal unit comprising a bake plate configured to heat a substrate supported on a surface of the bake plate; a chill plate configured to cool a substrate supported on a surface of the chill plate; and a substrate transfer shuttle configured to transfer substrates from the bake plate to the cool plate, wherein the substrate transfer shuttle has a temperature controlled substrate holding surface that is capable of cooling a substrate heated by the bake plate.

20 Claims, 16 Drawing Sheets

INTEGRATED THERMAL UNIT HAVING A SHUTTLE WITH TWO-AXIS MOVEMENT

CROSS-REFERENCES TO RELATED APPLICATIONS

This application is a continuation of U.S. patent application Ser. No. 11/174,781, filed Jul. 5, 2005, which claims priority to U.S. Provisional No. 60/639,109, filed Dec. 22, 2004, the disclosures of which are incorporated by reference herein in their entirety.

This application is related to U.S. application Ser. No. 11/174,988 filed Jul. 5, 2005; and to U.S. application Ser. No. 11/174,782 filed Jul. 5, 2005; and to U.S. application Ser. No. 11/174,681 filed Jul. 5, 2005. Each of the applications listed above are assigned to Sokudo Co., Ltd., the assignee of the present invention and are hereby incorporated by reference.

BACKGROUND OF THE INVENTION

The present invention relates generally to the field of substrate processing equipment. More particularly, the present invention relates to a method and apparatus for controlling the temperature of substrates, such as semiconductor substrates, used in the formation of integrated circuits.

Modern integrated circuits contain millions of individual elements that are formed by patterning the materials, such as silicon, metal and/or dielectric layers, that make up the integrated circuit to sizes that are small fractions of a micrometer. The technique used throughout the industry for forming such patterns is photolithography. A typical photolithography process sequence generally includes depositing one or more uniform photoresist (resist) layers on the surface of a substrate, drying and curing the deposited layers, patterning the substrate by exposing the photoresist layer to electromagnetic radiation that is suitable for modifying the exposed layer and then developing the patterned photoresist layer.

It is common in the semiconductor industry for many of the steps associated with the photolithography process to be performed in a multi-chamber processing system (e.g., a cluster tool) that has the capability to sequentially process semiconductor wafers in a controlled manner. One example of a cluster tool that is used to deposit (i.e., coat) and develop a photoresist material is commonly referred to as a track lithography tool.

Track lithography tools typically include a mainframe that houses multiple chambers (which are sometimes referred to herein as stations) dedicated to performing the various tasks associated with pre- and post-lithography processing. There are typically both wet and dry processing chambers within track lithography tools. Wet chambers include coat and/or develop bowls, while dry chambers include thermal control units that house bake and/or chill plates. Track lithography tools also frequently include one or more pod/cassette mounting devices, such as an industry standard FOUP (front opening unified pod), to receive substrates from and return substrates to the clean room, multiple substrate transfer robots to transfer substrates between the various chambers/stations of the track tool and an interface that allows the tool to be operatively coupled to a lithography exposure tool in order to transfer substrates into the exposure tool and receive substrates from the exposure tool after the substrates are processed within the exposure tool.

Over the years there has been a strong push within the semiconductor industry to shrink the size of semiconductor devices. The reduced feature sizes have caused the industry's tolerance to process variability to shrink, which, in turn, has resulted in semiconductor manufacturing specifications having more stringent requirements for process uniformity and repeatability. An important factor in minimizing process variability during track lithography processing sequences is to ensure that every substrate processed within the track lithography tool for a particular application has the same "wafer history." A substrate's wafer history is generally monitored and controlled by process engineers to ensure that all of the device fabrication processing variables that may later affect a device's performance are controlled, so that all substrates in the same batch are always processed the same way.

To ensure that each substrate has the same "wafer history" requires that each substrate experiences the same repeatable substrate processing steps (e.g., consistent coating process, consistent hard bake process, consistent chill process, etc.) and the timing between the various processing steps is the same for each substrate. Lithography type device fabrication processes can be especially sensitive to variations in process recipe variables and the timing between the recipe steps, which directly affects process variability and ultimately device performance.

In view of these requirements, the semiconductor industry is continuously researching methods and developing tools and techniques that can improve the uniformity in wafer history for track lithography and other types of cluster tools.

SUMMARY OF THE INVENTION

According to the present invention, methods and apparatus related to semiconductor manufacturing equipment are provided. More particularly, embodiments of the present invention relate to a method and apparatus for heating and/or cooling a substrate in a highly controllable manner. Embodiments of the invention contemplate multiple substrates being processed according to the same heating and cooling sequence in a highly controllable manner thus helping to ensure a consistent wafer history for each substrate. While some embodiments of the invention are particularly useful in heating and/or cooling substrates in a chamber or station of a track lithography tool, other embodiments of the invention can be used in other applications where it is desirable to heat and cool substrates in a highly controllable manner.

Certain embodiments of the invention pertain to an integrated thermal unit. According to one such embodiment, an integrated thermal unit comprises a bake plate configured to heat a substrate supported on a surface of the bake plate; a chill plate configured to cool a substrate supported on a surface of the chill plate; and a substrate transfer shuttle configured to transfer substrates from the bake plate to the cool plate, the substrate transfer shuttle having a temperature controlled substrate holding surface that is capable of cooling a substrate heated by the bake plate.

According to another embodiment of the invention, an integrated thermal unit comprises a bake station comprising a bake plate configured to hold and heat a substrate; a chill station comprising a chill plate configured to hold and cool a substrate; and a substrate transfer shuttle configured to transfer substrates from the bake plate to the chill plate along a horizontally linear path within the thermal unit and raise and lower substrates along a vertical path within the integrated thermal unit.

According to another embodiment of the invention, an integrated thermal unit comprises a bake plate having a substrate holding surface configured to hold and heat a substrate in a baking position; and a chill plate having a substrate holding surface configured to hold and cool a substrate in a cooling position where the substrate holding surface of the bake plate is positioned in a first substantially horizontal plane when the bake plate is in the baking position and the substrate holding surface of the chill plate is positioned in a second substantially horizontal plane that is below the first plane when the chill plate is in a cooling position.

According to still another embodiment of the invention, a bake station is provided. The bake station comprises a bake plate adapted to heat a substrate supported on an upper surface of the bake plate, the bake plate vertically moveable between an upper baking position and a lower cooling position; and a plurality of heat sinks adapted to be engageably coupled to a lower surface of the bake plate when the bake plate is in the lower cooling position.

Certain other embodiments of the invention pertain to a track lithography tool comprising a plurality of pod assemblies adapted to accept one or more cassettes of wafers and one or more robots adapted to transfer wafers from the one or more pod assemblies to processing modules within the track lithography tool, wherein at least one of the processing modules includes an integrated thermal unit according to one of the embodiments described above.

Still other embodiments of the invention pertain to methods of processing a substrate in an integrated thermal unit. According to one such embodiment, a method of processing a substrate in a integrated thermal unit having a bake plate and a chill plate comprises transferring a substrate having a liquid resist material applied thereon into the integrated thermal unit; positioning the substrate on the bake plate; heating the substrate with the bake plate; transferring the substrate from the bake plate to the chill plate with a shuttle having a temperature controlled surface; cooling the substrate with the chill plate; and transferring the substrate out of the integrated thermal unit.

According to another embodiment, a method of processing a substrate in a integrated thermal unit having a bake plate and a chill plate comprises transferring a substrate having a liquid resist material applied thereon into the integrated thermal unit; positioning the substrate on the bake plate; heating the substrate with the bake plate; transferring the substrate from the bake plate to the chill plate, wherein the transferring includes moving, within the integrated thermal unit, the substrate along a horizontally linear path and along a vertical path with a substrate transfer shuttle; cooling the substrate with the chill plate; and transferring the substrate out of the integrated thermal unit.

According to another embodiment, a method of processing a substrate in a integrated thermal unit having a bake plate and a chill plate comprises transferring a substrate having a liquid resist material applied thereon into the integrated thermal unit; positioning the substrate on the bake plate; heating the substrate with the bake plate; transferring the substrate from the bake plate to the chill plate with a shuttle having a temperature controlled surface; cooling the substrate with the chill plate; and transferring the substrate out of the integrated thermal unit.

According to still another embodiment of the invention a method of rapidly reducing a set point temperature of a bake plate is provided. This embodiment comprises, after using the bake plate to heat a substrate disposed on an upper surface of the bake plate while the bake plate is in a baking position, vertically moving the bake plate to a lower position in which a lower surface of the bake plate contacts a plurality of heat sinks adapted to be engageably coupled to the lower surface of the bake plate.

Many benefits are achieved by way of the present invention over conventional techniques. For example, including bake and chill plates in one integrated unit minimizes the delay associated with transferring a baked wafer to the chill plate. Also, the inclusion of a shuttle having a temperature controlled substrate holding surface that transfers wafers between the bake and chill plates provides an additional degree of control over each wafer's thermal history thus enabling a more uniform thermal history among multiple wafers. Moreover, embodiments of the invention increase chamber throughput by decreasing the load on the main, central robot(s) of a track lithography tool and provide a safe haven for post-bake wafers in case of a malfunction of a main, central robot. Other embodiments increase wafer throughput by decreasing the amount of time it take to change the set point temperature of a bake plate from a first temperature to a second temperature lower than the first temperature. Depending upon the embodiment, one or more of these benefits, as well as other benefits, may be achieved. These and other benefits will be described in more detail throughout the present specification and more particularly below in conjunction with the following drawings.

DETAILED DESCRIPTION OF SPECIFIC EMBODIMENTS

The present invention generally provides a method and apparatus for heating and cooling substrates in a highly controllable manner. While it is to be recognized that embodiments of the invention are particularly useful in helping to ensure a consistent wafer history for each substrate in a plurality of substrates that are heated and cooled according a particular thermal recipe within a track lithography tool, other embodiments of the invention can be used in other applications where it is desirable to heat and cool substrates in a highly controllable manner.

Figure 1:
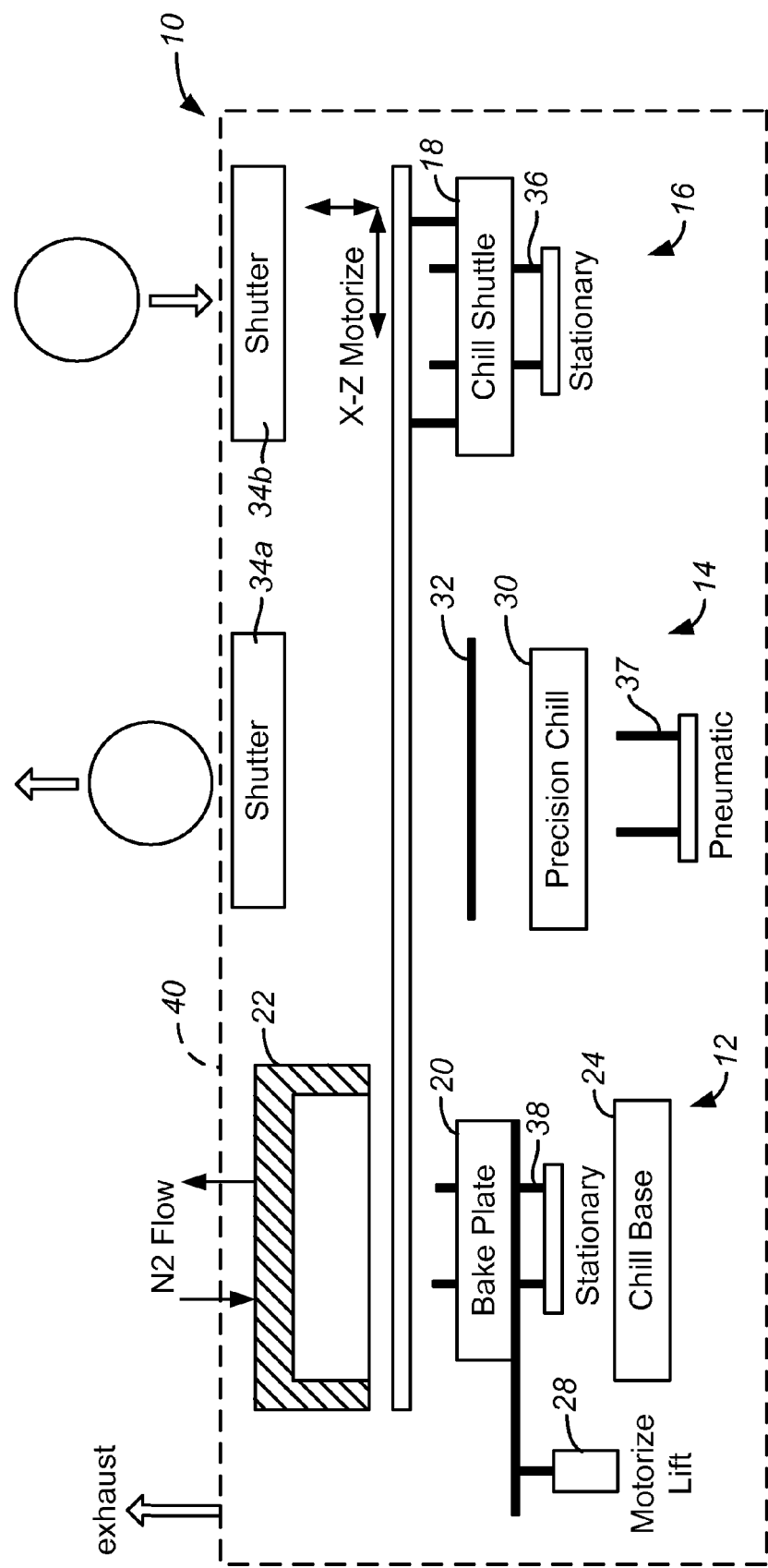
FIG. 1 is a conceptual view of one embodiment of an integrated thermal unit according to the present invention.

FIG. 1 is a simplified conceptual view of one embodiment of an integrated thermal unit 10 according to the present invention. Integrated thermal unit 10 includes a bake station 12, a chill station 14 and a shuttle station 16 all within an enclosed housing 40. Chill station 16 includes a shuttle 18 for transferring substrates between the bake and chill stations as needed. Bake station 12 includes a bake plate 20, an enclosure 22 and a chill base 24. Bake plate 20 is moveable between a wafer loading position (shown in FIG. 1), a closed heating position in which the bake plate is urged towards and within clam shell enclosure 22 by a motorized lift 28 and a cooling position in which the bake plate contacts chill base 24. Chill base 24 is engageably coupled to bake plate chill to enable the set point temperature of the bake plate to be rapidly changed from a relatively high, bake temperature to a lower bake temperature when, for example, switching to a new thermal recipe.

Chill station 14 includes a chill plate 30 and a particle shield 32 that protects a wafer situated on chill plate 30 from possible particle contamination when shuttle 18 passes over the chill station to transfer a wafer to or from bake station 12. Substrates can be transferred into and out of thermal unit 10 through elongated openings that are operatively coupled to shutters 34a and 34b, respectively.

Figure 2A:
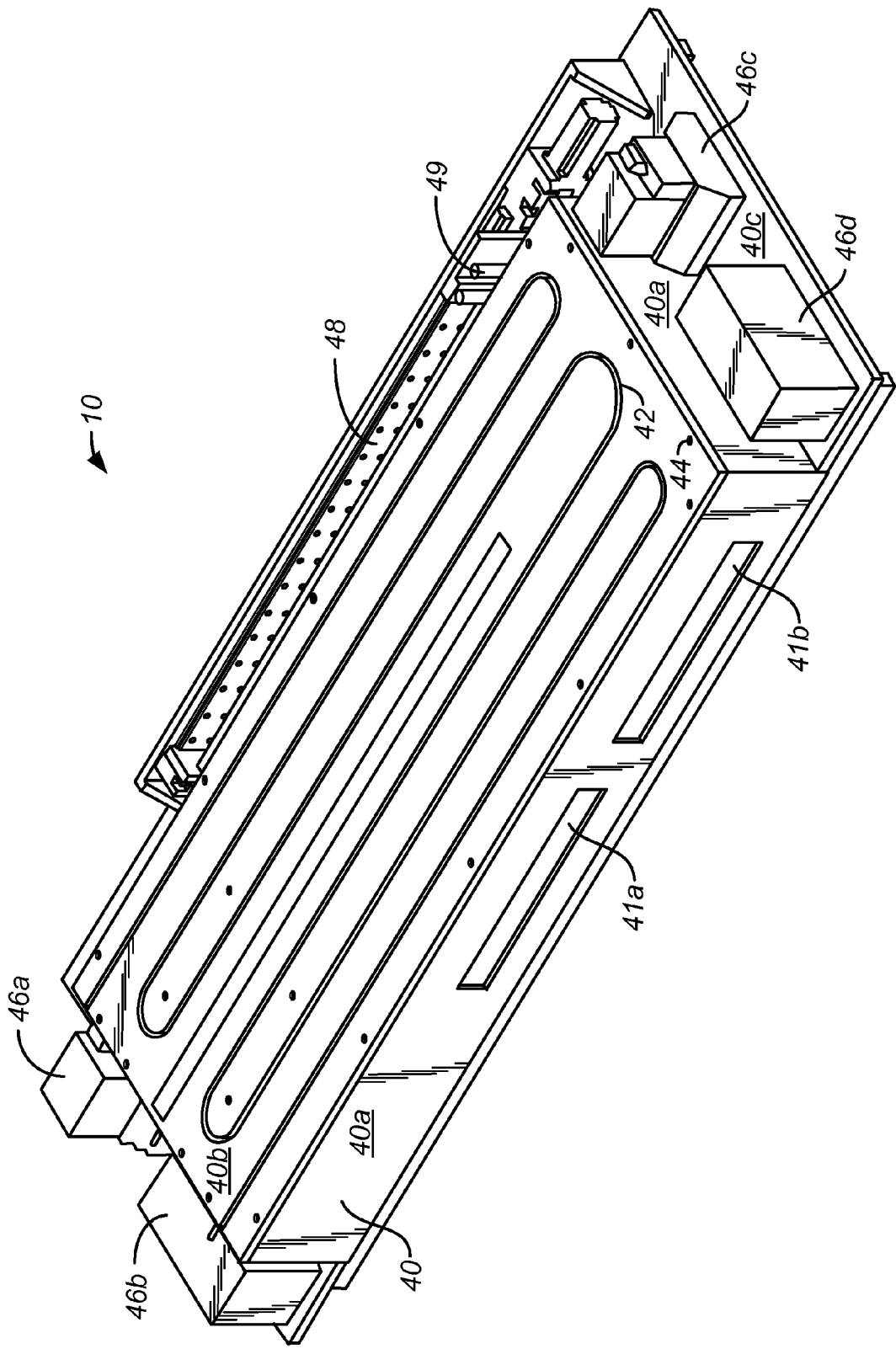
FIG. 2A is a simplified perspective view of the integrated thermal unit depicted in FIG. 1.

As shown in FIG. 2A, which is a simplified perspective view of integrated thermal unit 10 depicted in FIG. 1, thermal unit 10 includes an exterior housing 40 made of aluminum or another suitable material. Housing 40 is long relative to its height in order to allow bake station 12, chill station 14 and shuttle station 16 to be laterally adjacent to each other and to allow multiple integrated thermal units to be stacked on top of each other in a track lithography tool as described below with respect to FIG. 14. In one particular embodiment, housing 40 is just 20 centimeters high.

Housing 40 includes side pieces 40a, a top piece 40b and a bottom piece 40c. Front side piece 40a includes two elongated openings 41a, 41b that allow substrates to be transferred into and out of the thermal unit. Opening 41a is operatively coupled to be closed and sealed by shutter 34a (not shown) and opening 41b is operatively coupled to be closed and sealed by shutter 34b (also not shown). Top piece 40b of housing 40 includes coolant channels 42 that allow a coolant fluid to be circulated through the channels in order to control the temperature of top piece 40b when an appropriate plate (not shown) is attached to top piece 40b via screw holes 44. Similar coolant channels are formed in the lower surface of bottom piece 40c.

Also shown in FIG. 2A is various control circuitry 46a-46d which controls the precision baking operation of bake station 12 and the precision cooling operation of chill station 14; and tracks 48 and 49 that enable shuttle 18 (not visible within FIG. 2A) to move linearly along the length of the thermal unit and vertically within the thermal unit as discussed in more detail below. In one embodiment, control circuitry 46a-46b is positioned near stations 12 and 14 (e.g., within three feet) in order to enable more accurate and responsive control of temperature adjusting mechanisms associated with each station.

Figure 2B:
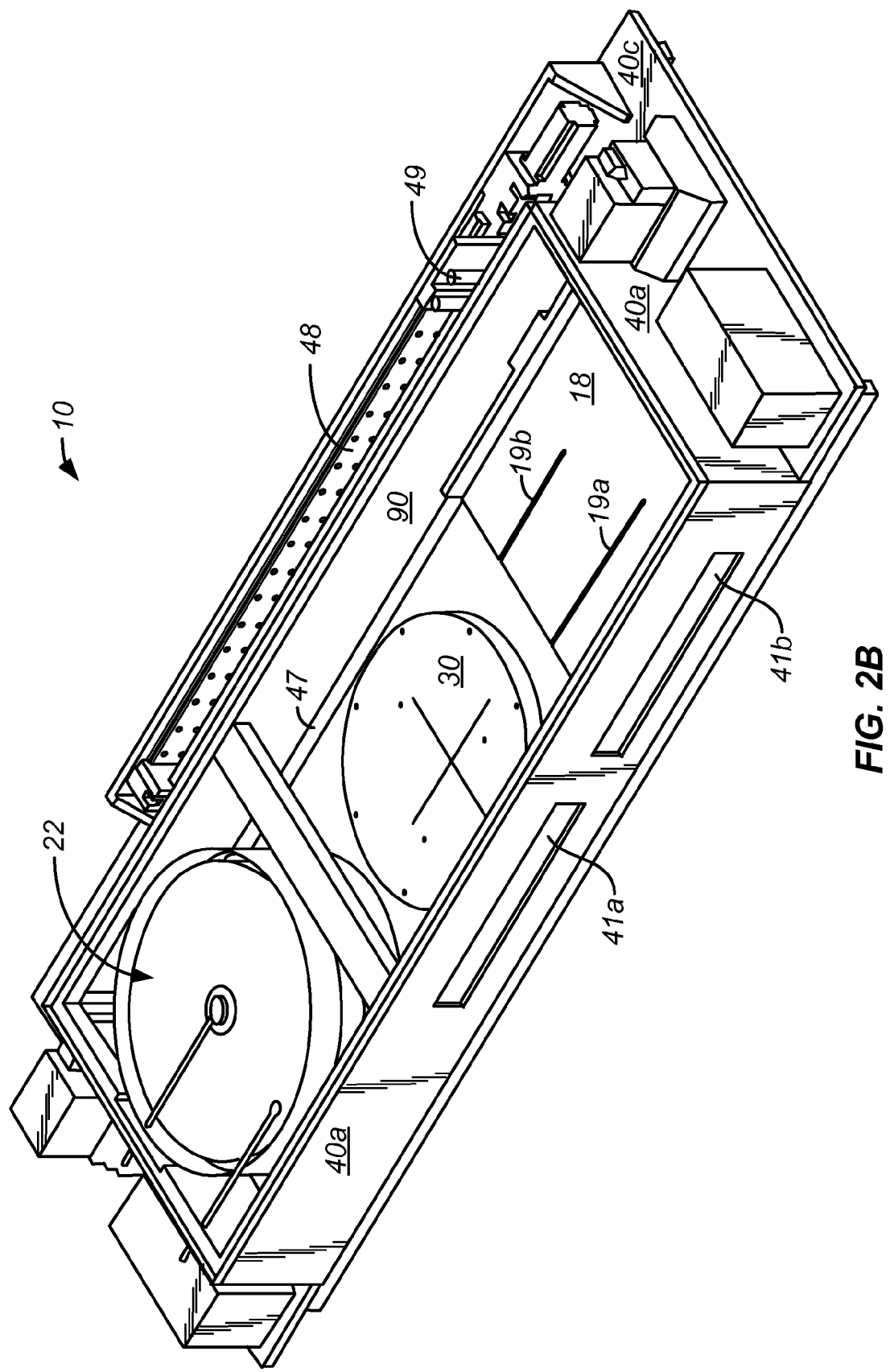
FIG. 2B is a simplified perspective view of integrated thermal unit 10 depicted in FIG. 2A with the top of the unit removed.

FIG. 2B is a simplified perspective view of integrated thermal unit 10 as seen with top 40b and particle shield 32 (shown in FIG. 1) removed. In FIG. 2B, shuttle 18, chill plate 30 and clam shell enclosure 22 of bake station 12 are visible. Also visible is a space 47 between rear support piece 90 of housing 40 and bottom piece 40c. Space 47, which is also visible in FIG. 5, extends along much of the length of integrated thermal unit 10 to allow shuttle 18 to transfer wafers between stations 12, 14 and 16 as discussed in detail below.

Figure 3:
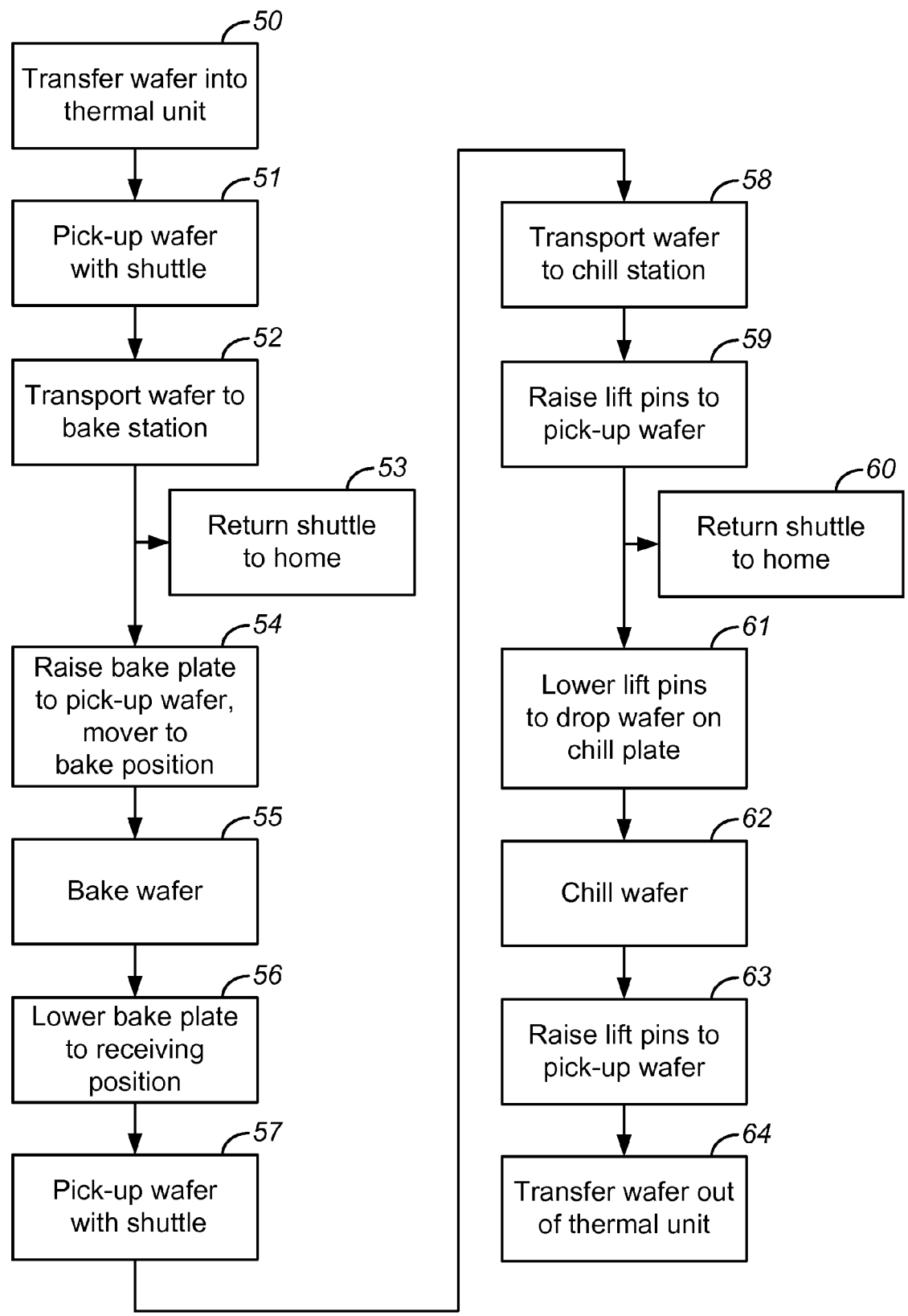
FIG. 3 is a block diagram that illustrates a sequence of events that are performed according to one embodiment of the method of the present invention.

In order to better appreciate and understand the general operation of integrated thermal unit 10, reference is now made to FIG. 3 along with FIGS. 1 and 2B. FIG. 3 is a simplified block diagram that illustrates a sequence of events that is performed by thermal unit 10 to thermally treat wafers according to one embodiment of the method of the present invention. A wafer may be treated in accordance with the process set forth in FIG. 3 after, for example, having a photoresist layer deposited over the wafer at an appropriate coating station of a track lithography tool. While the discussion below focuses on treating a single wafer within unit 10, a person of skill in the art will appreciate that thermal unit 10 will often be used to simultaneously process two wafers. For example, while one wafer is being heated on bake plate 20, thermal unit 10 can be in the process of cooling another wafer on chill plate 30 or transferring another wafer out of the thermal unit at the completion of its thermal treatment.

As shown in FIG. 3, a wafer's history in thermal unit 10 starts by transferring the wafer into the thermal unit 10 through wafer transfer slot 41b and placing the wafer onto stationary lift pins 36 (FIG. 1) at shuttle station 16 (FIG. 3, step 50). The wafer may be transferred into thermal unit 10 by, for example, a central robot that services both wafer transfer slots 41a and 41b as well as one or more coating or developing stations in a track lithography tool (not shown). Typically wafer transfer slot 41b is closed by shutter 34b, thus step 50 also includes moving shutter 34b to open slot 41b. During step 50 shuttle 18 is in a wafer receiving position at station 16 where lift pins 36 extend through slots 19a and 19b of the shuttle 18. After the wafer is properly positioned on lift pins 36, the robot arm recedes out of the thermal unit and chill shuttle 18 is raised to lift the wafer off of stationary lift pins 36 (FIG. 3, step 51) and then moved linearly along the length of the thermal unit to transfer the wafer to bake station 12 (FIG. 3, step 52). The path to bake station 12 takes shuttle 18 over particle shield 32 at chill station 14.

At bake station 12, the wafer is placed on lift pins 38 and shuttle 18 is free to handle another task or return to its home position at shuttle station 16 (FIG. 3, step 53). While the shuttle is being returned to home position, bake plate 20 is raised by motorized lift 28 thereby picking the wafer up off of stationary lift pins 38 and bringing the wafer into its bake position within clam shell enclosure 22 (FIG. 3, step 54). Once inside claim shell enclosure 22 the wafer is heated or baked according to a desired thermal recipe (FIG. 3, step 55).

After completion of bake step 55, the bake plate 20 is lowered to its wafer receiving position dropping the wafer off on lift pins 38 (FIG. 3, step 56). Next, shuttle 18 returns to bake station 12 and picks the wafer up off of lift pins 38 (FIG. 3, step 57) and brings the wafer to chill station 14 (FIG. 3, step 58). The path to chill station 14 takes shuttle over particle shield 32 to shuttle station 16 where shuttle 18 is lowered and then moved towards chill station 14. Once at chill station 14, lift pins 37 are raised by a pneumatic lift to lift the wafer off of the shuttle (FIG. 3, step 59). Shuttle 18 is then free to handle another task or return to its home position at station 16 (FIG. 3, step 60) and lift pins 37 are lowered to drop the wafer of onto chill plate 30 (FIG. 3, step 61).

The wafer is then cooled on chill plate 30 according to a predetermined thermal recipe (FIG. 3, step 62). After completion of the cooling process, lift pins 37 are raised to pick the wafer up off of the chill plate (FIG. 3, step 63) and the wafer is transferred out of the integrated thermal unit through elongated slot 41a (FIG. 3, step 64) by, for example, being picked up by the same central robot that transferred the wafer into the thermal unit in step 50. Typically, elongated slot 41a is closed by shutter 34a, thus step 64 also includes opening shutter 34a to open slot 41a.

Embodiments of the invention allow a process such as that described above to be carried out in a highly controllable and highly repeatable manner. Thus, embodiments of the invention help ensure an extremely high degree of uniformity in the thermal treatment of each wafer that is processed within integrated thermal unit 10 according to a particular thermal recipe. As discussed in more detail below, a number of specific aspects of the present invention can be used independent from each other or in combination to help achieve such a repeatable, uniform wafer history.

One such aspect is the placement of hot plate 20 with respect to chill plate 30. Specifically, in some embodiments of the invention hot plate 20 is positioned within integrated thermal unit 10 at a position that is higher than the position of chill plate 30. Because heat generated from bake plate 20 generally rises to an upper portion of thermal unit 10, such positioning helps minimize thermal cross-talk between the bake station and chill station that may otherwise lead to discrepancies in the thermal treatment of wafers over time.

Figure 4:
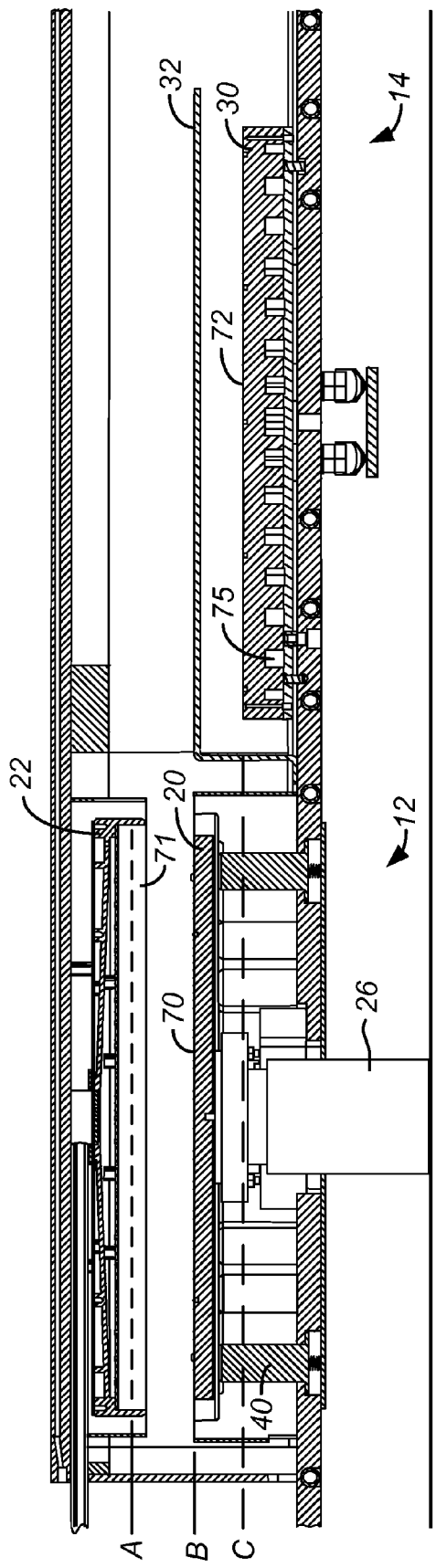
FIG. 4 is a cross-sectional view of bake station 12 and chill station 14 shown in FIG. 2B.

This aspect of the invention is illustrated in FIG. 4, which is a simplified cross-sectional view of a portion of integrated thermal unit 10 showing bake plate 20 and chill plate 30. As shown in FIG. 4, when hot plate 20 is within claim shell enclosure 22 at a baking position 71, wafer support surface 70 lies in a horizontal plane A that is well above the horizontal plane C that wafer support surface 72 of chill plate 30 lies in. In some embodiments plane A is at least 4 cm above plane C and in one particular embodiment plane A is 6 cm above plane C. Furthermore, in some embodiments of the invention even when the bake plate is engaged with heat sinks 140 (described below) while in a wafer receiving position, upper surface 70 of the bake plate lies in a horizontal plane B that is above the upper surface 72 of the chill plate (plane C). In some embodiments plane B is at least 2 cm above plane C and in one particular embodiments plane B is 2.5 cm above plane C. Also, in some embodiments the upper surface of particle shield 32 also lies in or substantially closed to plane B.

Maintaining such a height difference in the positions of bake plate 20 and chill plate 30 helps minimize thermal cross-talk between the two stations and helps ensure a highly controlled, repeatable thermal treatment among multiple wafers.

Figure 5:
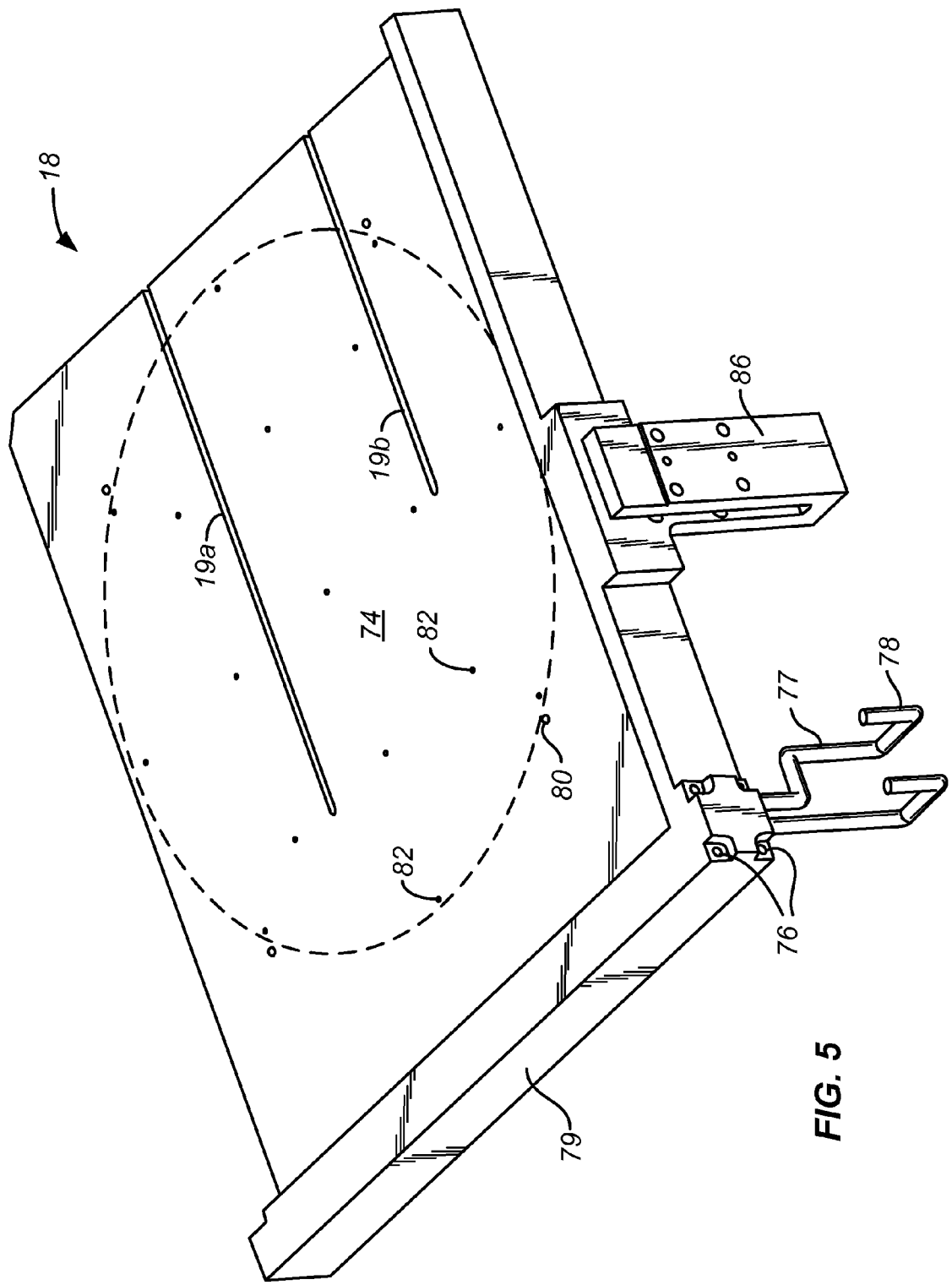
FIG. 5 is a perspective view of chill shuttle 18 shown FIG. 2B according to one embodiment of the invention.

Another aspect of the present invention that helps ensure an extremely high degree of uniformity in the thermal treatment of each wafer is the design of shuttle 18. As shown in FIG. 5, which is a simplified perspective view of shuttle 18, the shuttle includes a wafer receiving area 74 upon which a semiconductor wafer is placed while the shuttle is transferring the wafer from one station to another. In one embodiment, shuttle 18 is made from aluminum and wafer receiving area 74 and other portions of an upper surface 75 of the shuttle are actively cooled by a coolant (e.g., deionized water) that flows through coolant passages (shown in FIG. 4 as passages 75) in the shuttle.

The coolant is delivered to passages 75 by tubes that connect to inlets/outlets 76, which in turn connect to a manifold (not shown) within portion 79 of shuttle 18 that helps distribute the fluid evenly throughout the shuttle. The fluid tubes are at least partially supported by fingers 78 of tube support mechanism 77 as shuttle 18 traverses the length of the integrated thermal unit. Actively cooling wafer receiving surface 74 helps maintain precise thermal control of wafer temperature during all times while the wafer is within thermal unit 10. Actively cooling shuttle 18 also starts the wafer cooling process sooner than it would otherwise be initiated if such active cooling did not occur until the wafer is transferred to a dedicated chill station, which in turn reduces the overall thermal budget of the wafer.

Figure 7:
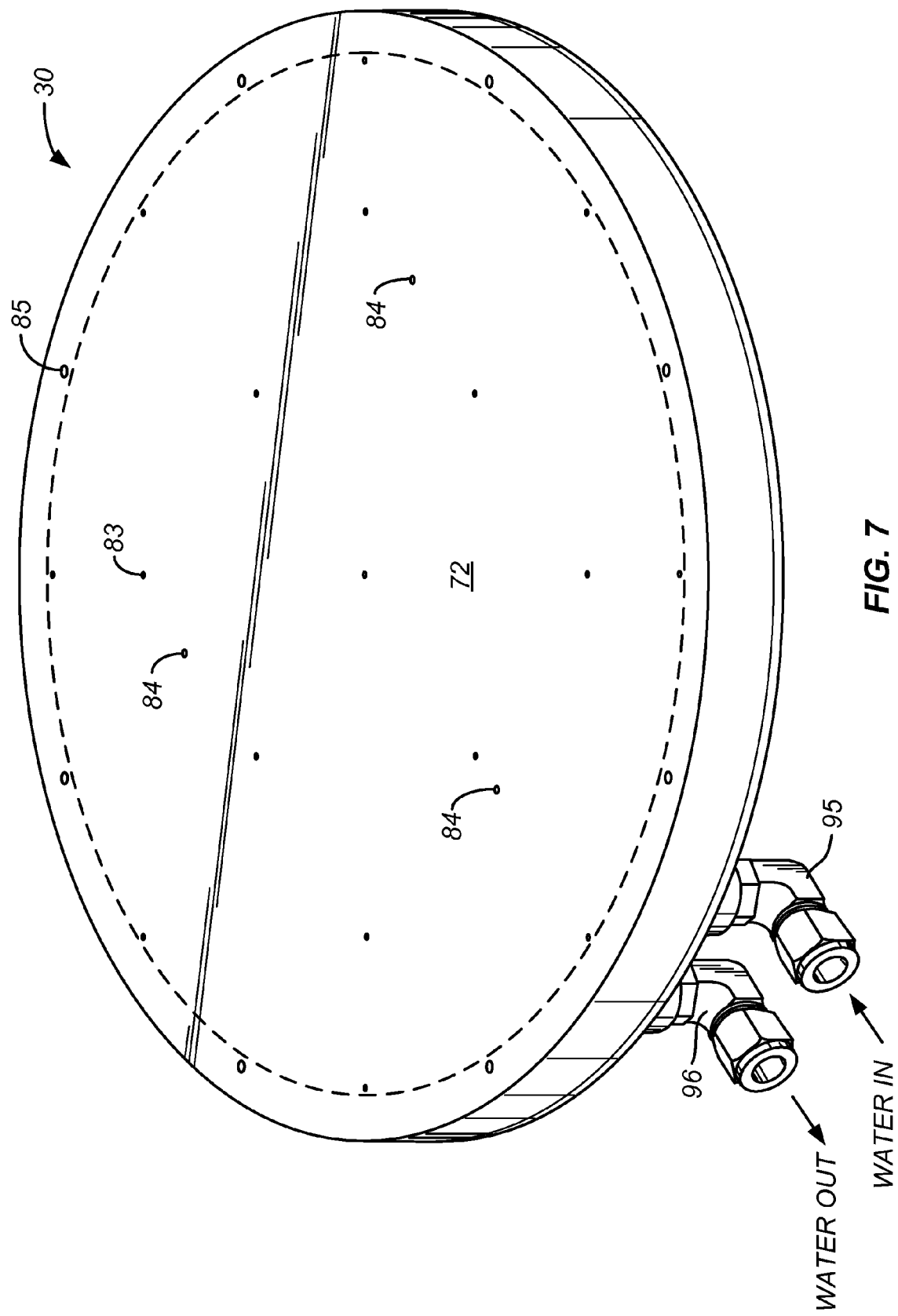
FIG. 7 is a perspective view of chill plate 30 shown FIG. 2B according to one embodiment of the invention.

Also shown in FIG. 5 are slots 19a, 19b, wafer pocket buttons 80 and small contact area proximity pins 82 and slots 19a, 19b. Slots 19a, 19b allow the shuttle to be positioned or moved under a wafer being held by lift pins. For example, in chill station 14 a wafer is held above the chill plate prior to and after chill step 63 on a set of three lift pins arranged in a triangular formation (see FIG. 7 showing holes 84 that allow the lift pins to extend through chill plate 30). Slot 19a is aligned to allow shuttle 18 to slide past two of the three lift pins and slot 19b is aligned to allow the shuttle to slide pass the third lift pin. Pocket buttons 80 screw into threaded holes in the upper surface of shuttle 18 and extend above the surface to help center a wafer within wafer receiving area 74. Pocket buttons 80 can be made from any appropriately soft material, such as a thermoplastic material, that exhibits strong fatigue resistance and thermal stability. In one embodiment, buttons 80 are made from polyetheretherketone, which is also known as PEEK.

Proximity pins 82 are distributed across upper surface 74 of shuttle 18 and are fabricated from a material with a low coefficient of friction, such as sapphire. Proximity pins 82 allow the wafer being transported by shuttle 18 to be brought into very close proximity of temperature controlled surface 74. The small space between the wafer and temperature controlled surface 74 helps create uniform cooling across the entire surface area of the wafer while at the same time minimizing contact between the underside of the wafer and the shuttle thus reducing the likelihood that particles or contaminants may be generated from such contact. Further details of proximity pins 82 are set forth in U.S. application Ser. No. 11/111,155, entitled "Purged Vacuum Chuck with Proximity Pins" filed on Apr. 20, 2005, which is hereby incorporated by reference for all purposes. In one particular embodiment shuttle 18 includes four pocket buttons 80 and seventeen proximity pins 82.

Figure 6:
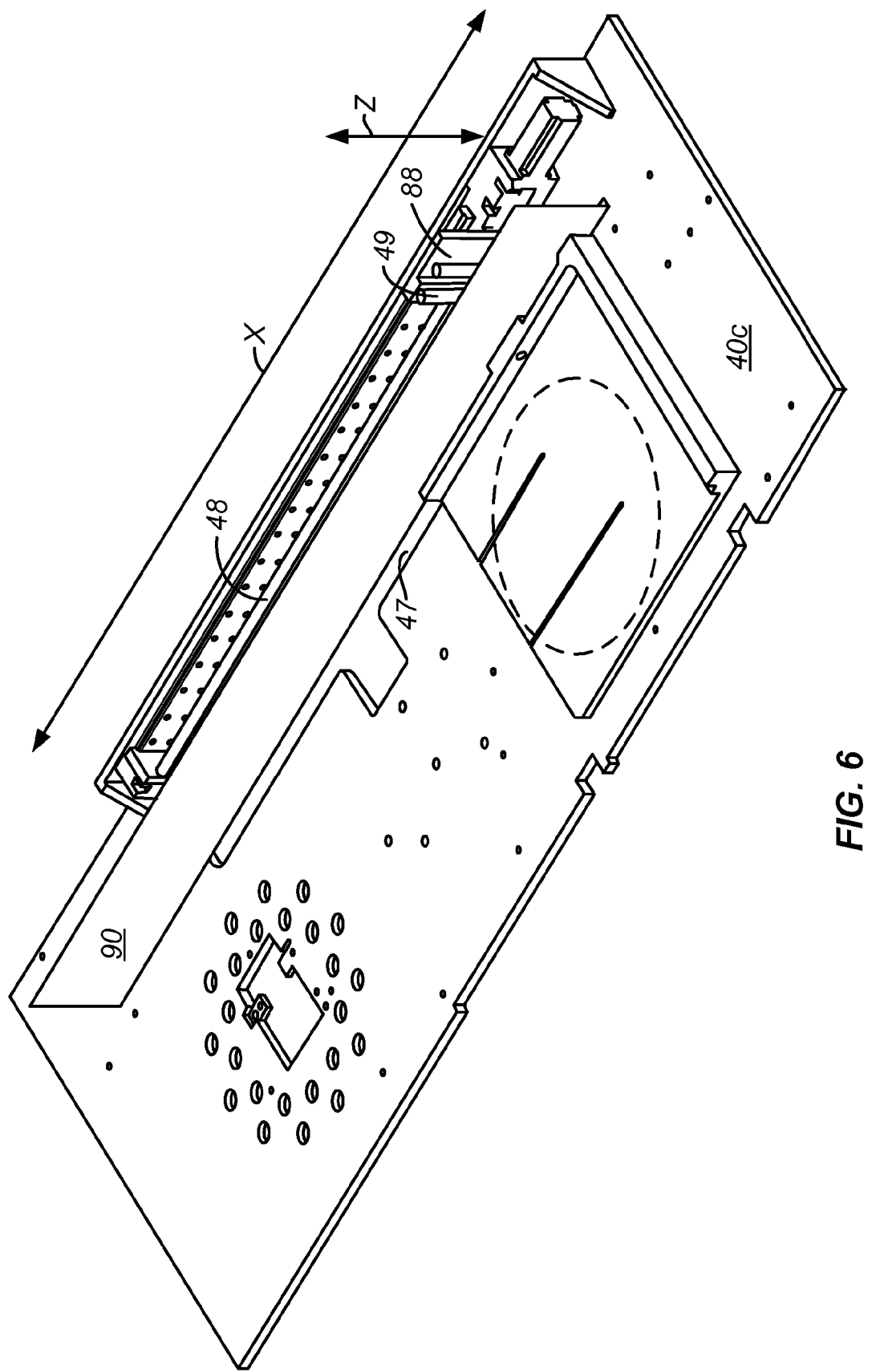
FIG. 6 is a perspective view of a portion of the integrated thermal unit shown in FIG. 2B having bake station 12 and chill station 14 removed.

Shuttle 18 also includes an elongated U-shaped support bracket 86 that allows the shuttle to be mounted to a support plate 88 shown in FIG. 6, which is a perspective view of a portion of integrated thermal unit 10 having bake station 12 and chill station 14 removed. As seen in FIG. 6, support plate 88 loops under and around rear support piece 90, which is mounted to bottom plate 40c, through slot 47. Plate 88 (and thus shuttle 18) can be moved linearly along a track 48 (horizontal path X). Plate 88 also slides vertically along track 49 allowing shuttle 18 to be raised and lowered (vertical path Z) in order to pick up and/or drop off wafers at a particular station.

Referring now to FIG. 7, which is a perspective view of chill plate 30 according to one embodiment of the invention, chill plate 30 includes a coolant inlet 95 and outlet 96 that allow a coolant liquid, such as deionized water, to be circulated through coolant channels (not shown) to cool a wafer supported on wafer support surface 72. Chill plate 30 also includes a number of wafer pocket buttons 85 and small contact area proximity pins 83 that are similar to buttons 80 and proximity pins 82 described above with respect to FIG. 5. In one particular embodiment, chill plate 30 includes eight pocket buttons 85 and seventeen proximity pins 83. Also, while not shown in FIG. 7, chill plate 30 may include a plurality of vacuum ports and be operatively coupled to a vacuum chuck to secure a wafer to the chill plate during the cooling process.

Also not shown in FIG. 7, a particle shield 32 (shown in FIG. 1) is positioned above chill plate 30 in order to protect the chill plate, and any wafer positioned on the chill plate, from possible particle contamination when shuttle 18 traverses between bake station 12 and shuttle station 16 over chill plate 30. Particle shield 32 is connected to bottom housing piece 40c between bake station 12 and chill station 14 (see FIG. 4) and front side piece 40a of housing 40 in a manner that allows shuttle 18 to pass under the particle shield and access chill plate 30 as needed. In one particular embodiment, particle shield 32 is made from stainless steel.

Figure 8:
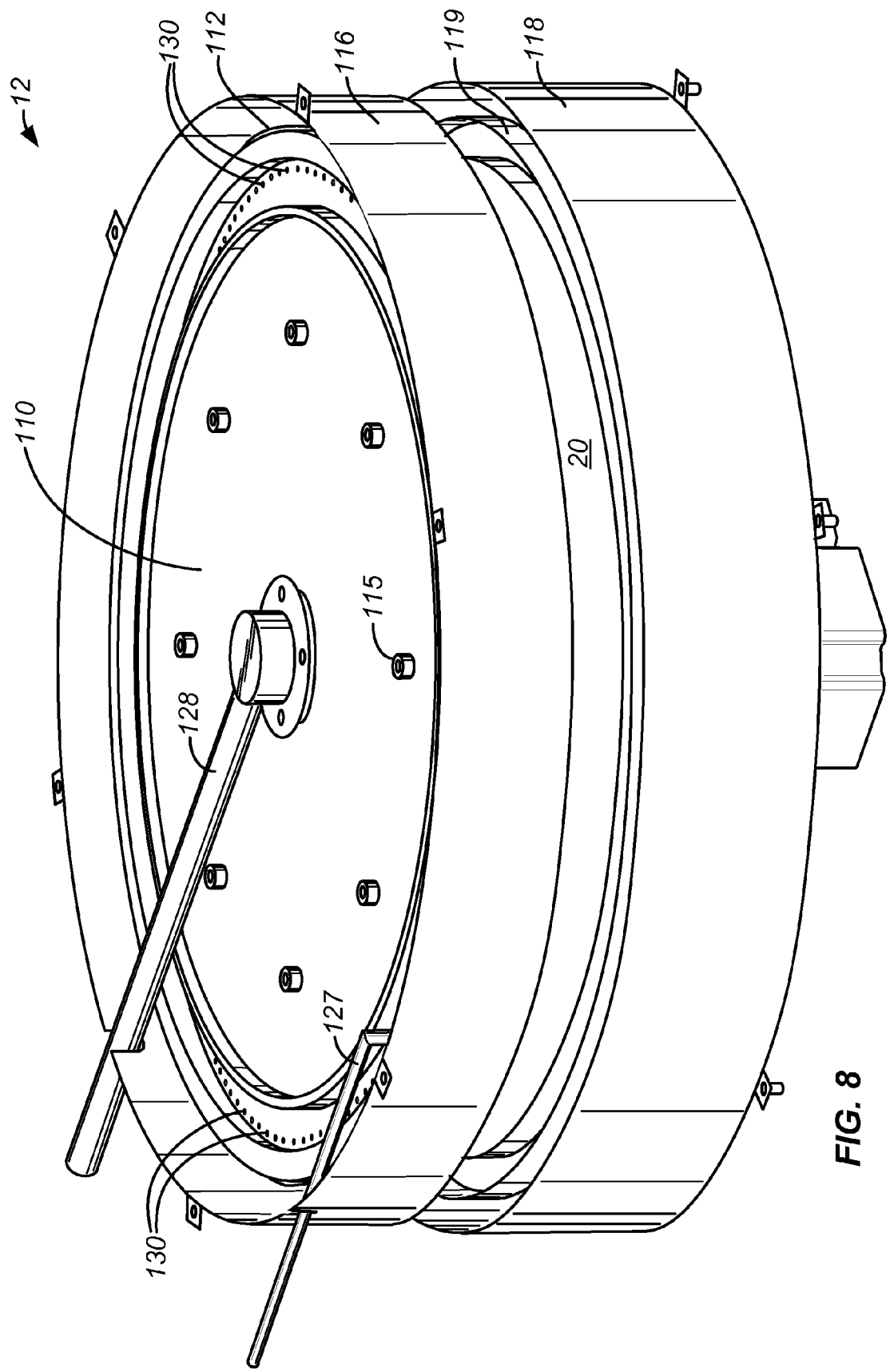
FIG. 8 is perspective view of bake plate 20 shown FIG. 2B according to one embodiment of the invention.
Figure 9:
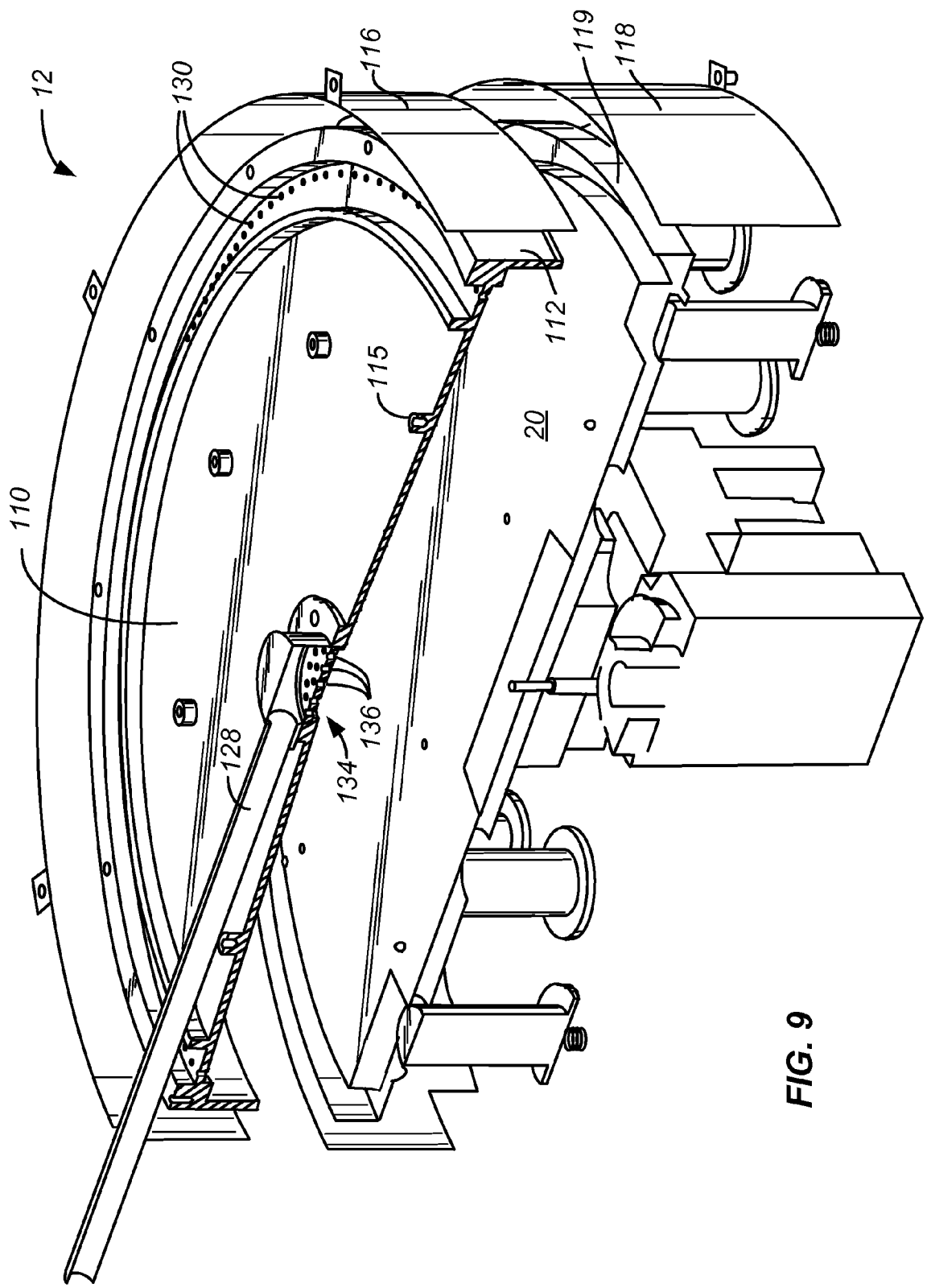
FIG. 9 is a perspective view of a cross-section of bake plate 20 shown FIG. 8.
Figure 10:
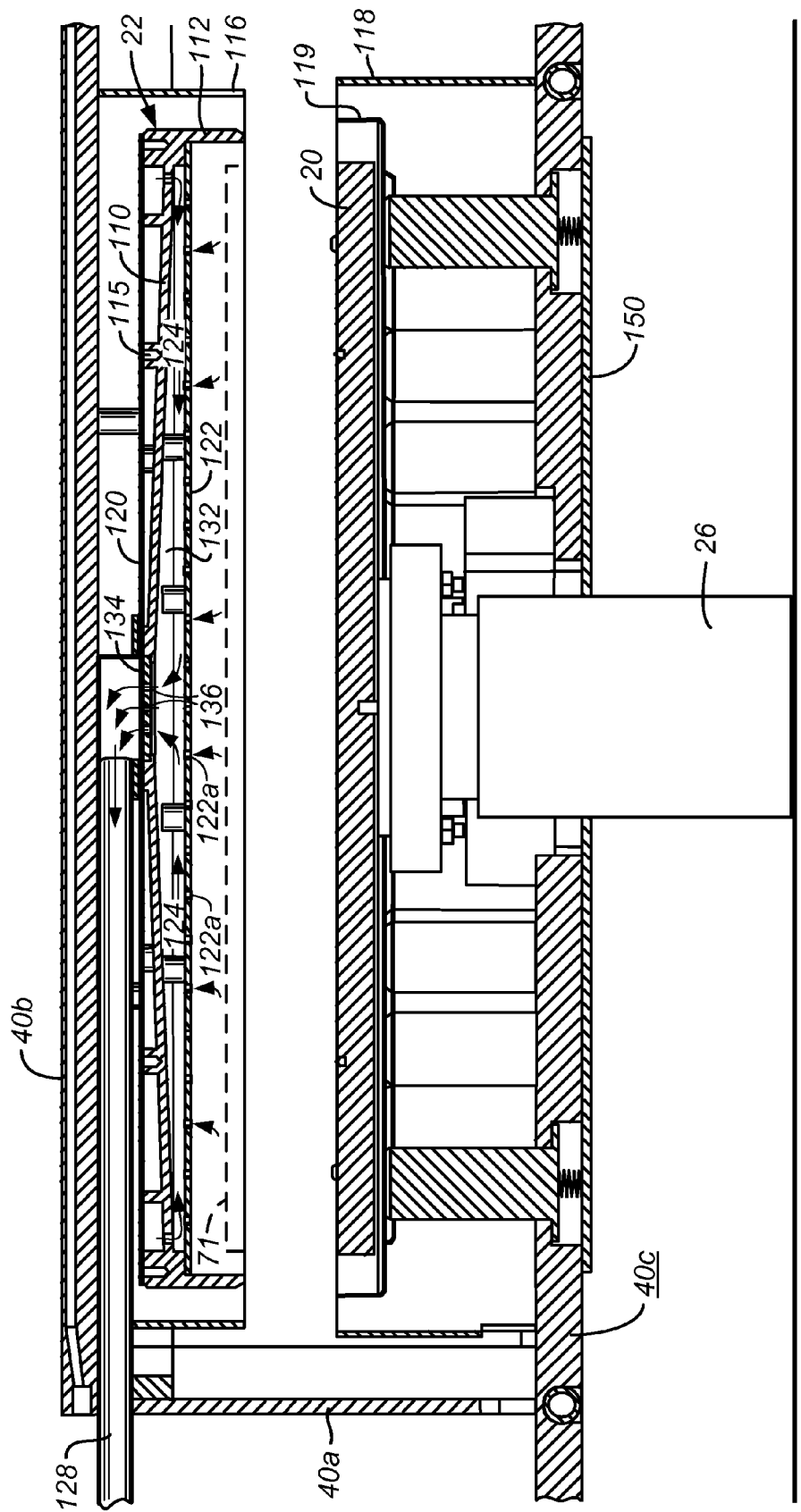
FIG. 10 is a cross-sectional view of bake plate 20 shown in FIGS. 8 and 9.

Reference is now made to FIGS. 8, 9 and 10 where FIG. 8 is a perspective view of bake station 12 shown FIG. 2B according to one embodiment of the invention; FIG. 9 is a perspective view of a cross-section of bake station 12 shown FIG. 8 and FIG. 10 is a cross-sectional view of the bake station. As shown in FIGS. 8-10, bake station 12 has three separate isothermal heating elements: bake plate 20, top heat plate 110 and side heat plate 112, each of which is manufactured from a material exhibiting high heat conductivity, such as aluminum or other appropriate material. Each plate 20, 110, 112 has a heating element, for example, resistive heating elements, embedded within the plate. Bake station 12 also includes side top and bottom heat shields 116 and 118, respectively, as well as a bottom cup 119 that surrounds bake plate 20 and a lid 120 (shown in FIG. 10 only). Each of heat shields 116, 118, cup 119 and lid 120 are made from aluminum. Lid 120 is attached to top heat plate 110 by eight screws that are threaded through threaded holes 115.

Bake plate 20 is operatively coupled to a motorized lift 26 so that the bake plate can be raised into a clam shell enclosure 22 and lowered into a wafer receiving position. Typically, wafers are heated on bake plate 20 when it is raised to a baking position as shown in FIG. 4, position 71. When in the baking position, cup 119 encircles a bottom portion of side heat plate 112 forming a clam shell arrangement that helps confine heat generated by bake plate 20 within an inner cavity formed by the bake plate and enclosure 22. In one embodiment the upper surface of bake plate 20 includes 8 wafer pocket buttons and 17 proximity pins similar to those described with respect to shuttle 18 and chill plate 30. Also, in one embodiment bake plate 20 includes a plurality of vacuum ports and be operatively coupled to a vacuum chuck to secure a wafer to the bake plate during the baking process.

During the baking process, a faceplate 122 is positioned just above and opposite wafer support surface 70 of bake plate 20. Faceplate 122 can be made from aluminum as well as other suitable materials and includes a plurality of holes or channels 122a that allow gases and contaminants baked off the surface of a wafer being baked on bake plate 20 to drift through faceplate 122 and into a radially inward gas flow 124 that is created between faceplate 122 and top heat plate 110.

Gas from radially inward gas flow 124 is initially introduced into bake station 12 at an annular gas manifold 126 that encircles the outer portion of top heat plate 110 by a gas inlet line 127. Gas manifold 126 includes numerous small gas inlets 130 (128 inlets in one embodiment) that allow gas to flow from manifold 126 into the cavity 132 between the lower surface of top heat plate 110 and the upper surface of faceplate 122. The gas flows radially inward towards the center of the station through a diffusion plate 134 that includes a plurality of gas outlet holes 136. After flowing through diffusion plate 134, gas exits bake station 12 through gas outlet line 128.

Figure 11:
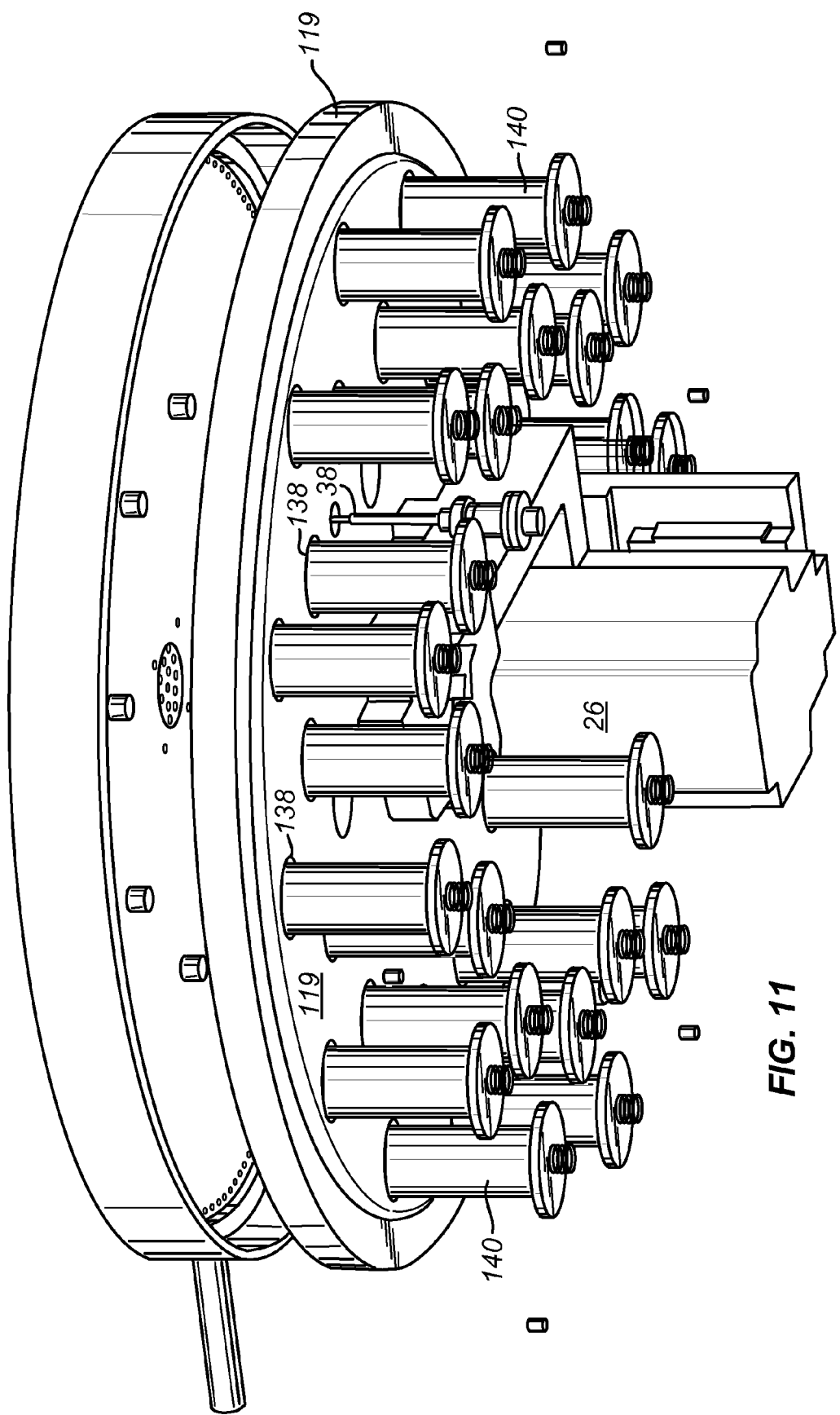
FIG. 11 is bottom perspective view of bake station 12 shown FIG. 8.

An aspect of the invention that helps minimize any delay associated with switching from one thermal recipe to another thermal recipe an thus helps ensure high wafer throughput through integrated thermal unit 10 is discussed below with respect to FIGS. 11 and 12. FIG. 11 is a bottom perspective view of bake station 12 shown FIGS. 8-10. As shown in FIG. 11, in one embodiment of the invention bake station 12 includes a plurality of engageable heat sinks 140. Each engageable heat sink 140 is made from an appropriate heat sink material, such as aluminum, copper, stainless steel or other metal.

As previously mentioned, bake plate 20 heats a wafer according to a particular thermal recipe. One component of the thermal recipe is typically a set point temperature at which the bake plate is set to heat the wafer. During the baking process, the temperature of the wafer is routinely measured and one or more zones of the bake plate can be adjusted to ensure uniform heating of the substrate. Typically bake plate is heated to the desired set point temperature while a large batch of wafers are processed according to the same thermal recipe. Thus, for example, if a particular thermal recipe calls for a set point temperature of 175° C. and that recipe is to be implemented on 100 consecutive wafers, bake plate 20 will be heated to 175° C. during the length of time it takes to process the 100 consecutive wafers. If, however, a subsequent batch of 200 wafers is to be processed according to a different thermal recipe that, for example, requires a set point temperature of 130° C., the set point temperature of bake plate 20 needs to be rapidly changed from 175° C. to 130° C. between processing the 100th and 101st wafers.

Embodiments of the present invention enable a rapid reduction in the set point temperature of bake plate 20 by lowering the bake plate with motor 26 into a lower cooling position that is below the wafer receiving position. In the cooling position a bottom surface 73 of the bake plate contacts an upper surface 142 of each heat sink 140. Contact between the heat sinks and bake plate is possible because bottom cup 119 includes a plurality of holes 138 that correspond to the plurality of heat sinks 140 allowing the heat sinks to extend through bottom cup 119 to contact bake plate 20.

Figure 12:
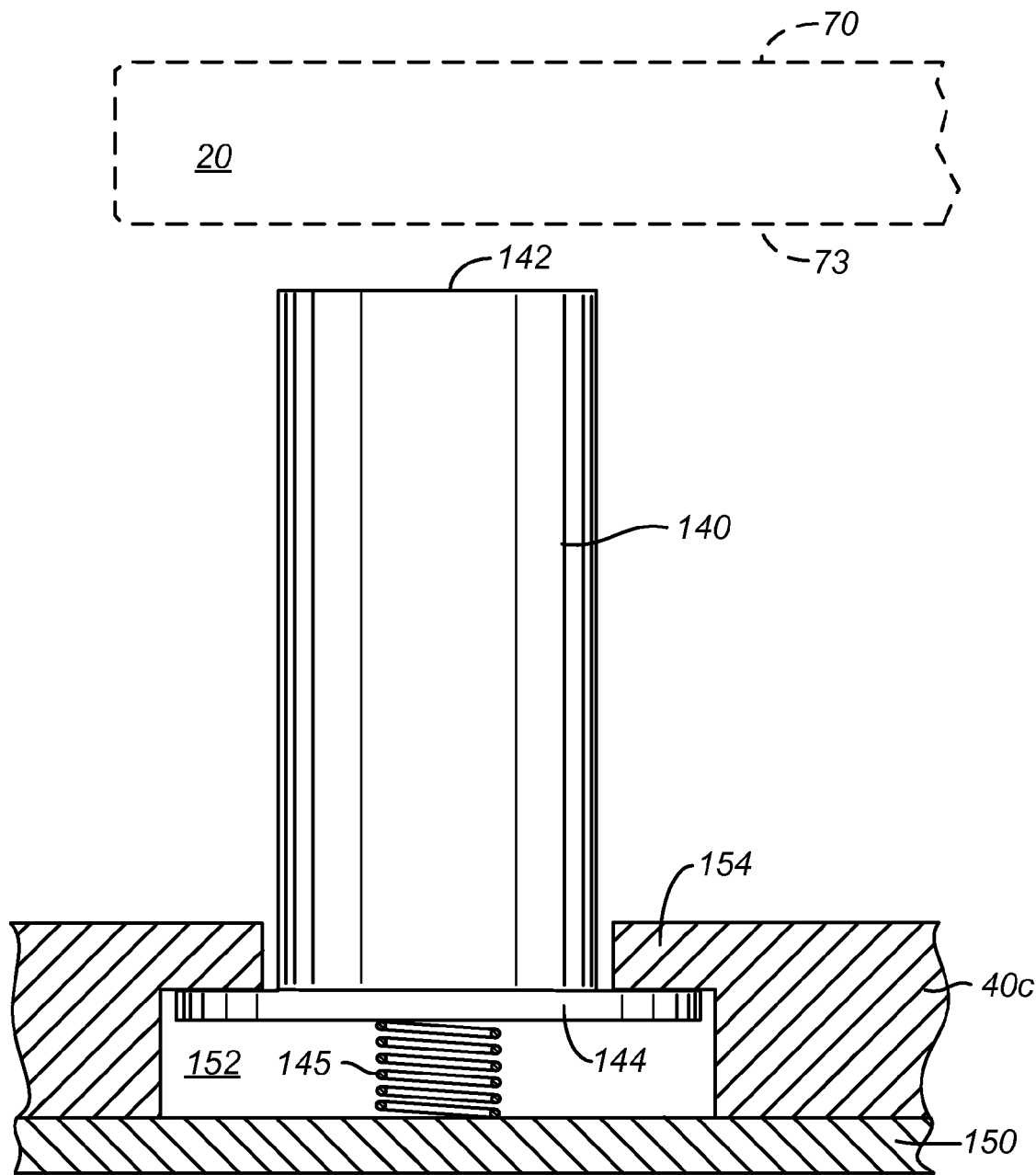
FIG. 12 is a simplified cross-sectional view of an engageable heat sink 140 shown in FIG. 11.

FIG. 12 is a simplified cross-sectional view of an engageable heat sink 140. As shown in FIG. 12, each engageable heat sink 140 includes a lower base portion 144 that has a larger diameter than the main body of the heat sink. Lower base portion 144 fits within a cavity 152 that is defined by bottom base plate 40c and an aluminum plate 150. Base portion 144 of the heat sink engages a lip 154 of the bottom base plate and is pressed against the lip by a spring 145 positioned between aluminum plate 150 and base portion 144.

When bake plate 20 is lowered into the cooling position, spring 145 causes heat sink 140 to press upon lower surface of 73 of the bake plate. The combined thermal mass of all heat sinks 140 allows bake plate 20 to be rapidly cooled from one set point temperature to a lower set point temperature as may be required, for example, when transitioning to a new thermal recipe.

While heat sink 140 shown in FIGS. 11 and 12 is shown to be cylindrical in shape, many other shapes and sizes can be used. Also, in some embodiments, each heat sink 140 can be actively cooled by forming one or more coolant channels within the body of the heat sink. Also in some embodiments, heat sink 140 includes a thermal pad on its upper surface 142 that provides for smooth contact between the heat sink and bake plate during the engaging process.

Figure 13:
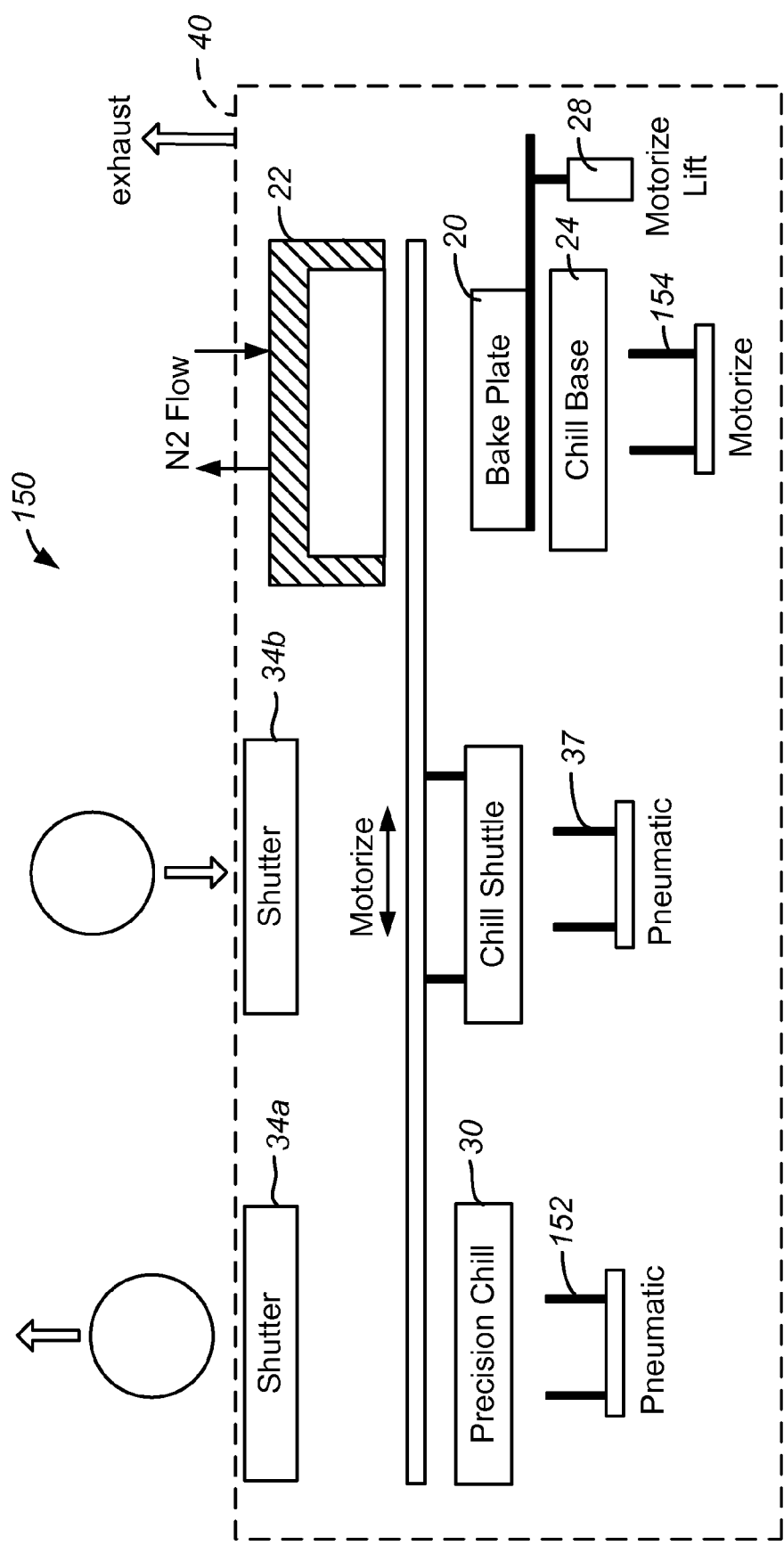
FIG. 13 is a conceptual view of an alternative embodiment of an integrated thermal unit according to the present invention.

FIG. 13 is a conceptual view of an alternative embodiment of an integrated thermal unit 150 according to the present invention. One primary difference between the embodiment of the invention shown in FIG. 13 and the embodiment shown in FIG. 1 is the placement of the bake, chill and shuttle stations 12, 14 and 16, respectively. In FIG. 13, the shuttle (shuttle 152 as compared to shuttle 18) has been moved to a central position between the bake station and chill station. Such an arrangement provides a benefit in further reducing thermal cross-talk between the bake and chill stations and also alleviates the need for particle shield 32 to be positioned over chill plate 30 because shuttle 18 does not need to "fly over" the chill plate to deliver a wafer to bake plate 20. One benefit of the arrangement of FIG. 1 as compared to that of FIG. 13 is the separation of shuttle 18 from bake plate 20 when the shuttle is in a position to receive wafers passed into the integrated thermal unit.

Also, shuttle 152 in FIG. 13 is operatively configured to move linearly along a X-axis (horizontal path) along the length of housing 40 but is not configured to be moveable vertically. This difference requires moveable lift pins at each of the bake, chill and shuttle stations in order to properly exchange wafers between shuttle 152 and the station.

Figure 14:
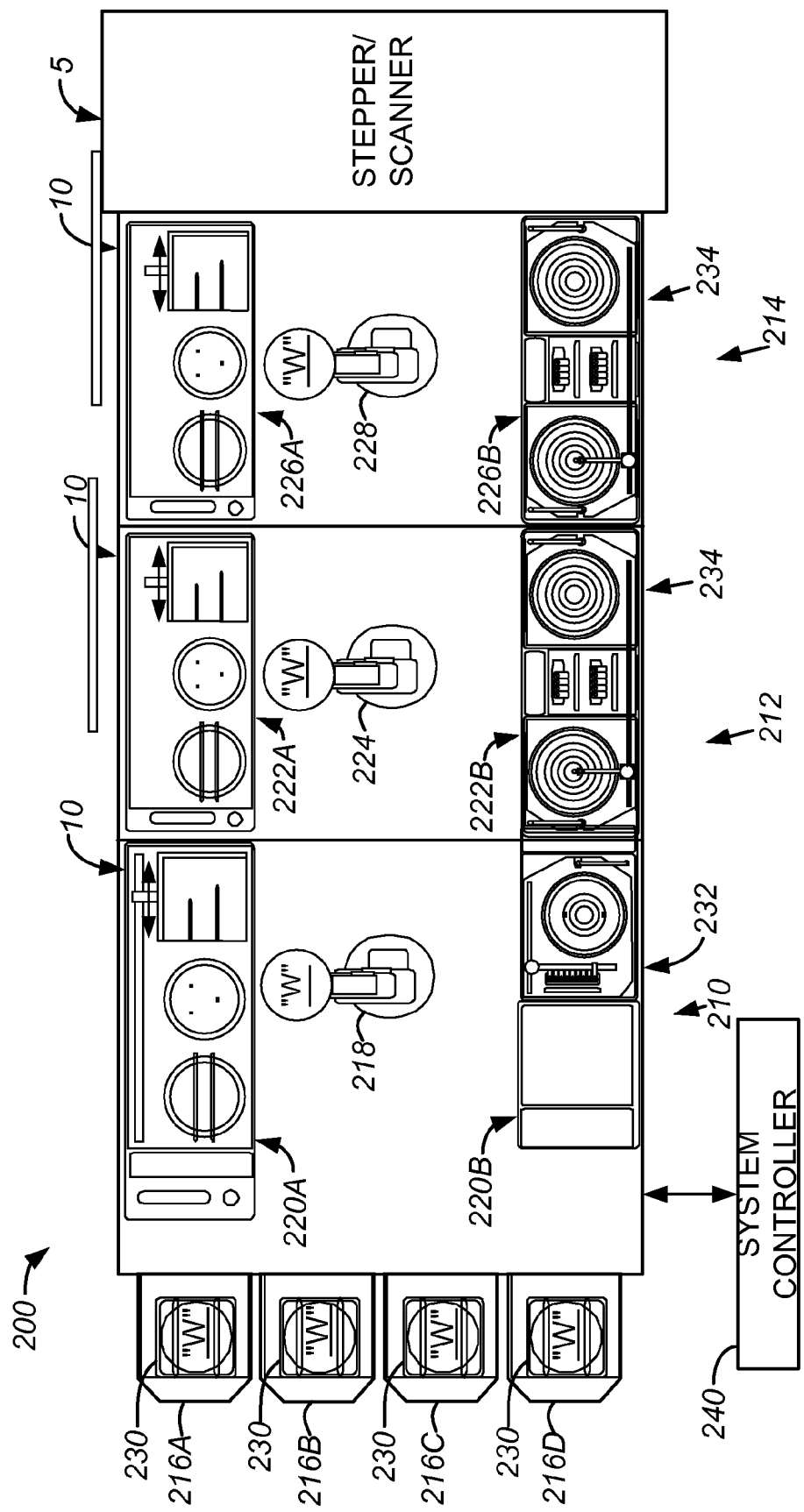
FIG. 14 is a plan view of one embodiment of a track lithography tool according to one embodiment of the present invention.

FIG. 14 is a plan view of one embodiment of a track lithography tool 200 in which the embodiments of the present invention may be used. As illustrated in FIG. 14, track lithography 200 contains a front end module 210 (sometimes referred to as a factory interface) 210, a central module 212, and a rear module 214 (sometimes referred to as a scanner interface). Front end module 210 generally contains one or more pod assemblies or FOUPS (e.g., items 216A-D), a front end robot 218, and front end processing racks 220A, 220B. The one or more pod assemblies 216A-D are generally adapted to accept one or more cassettes 230 that may contain one or more substrates "W", or wafers, that are to be processed in track lithography tool 200.

Central module 212 generally contains a first central processing rack 222A, a second central processing rack 222B, and a central robot 224. Rear module 214 generally contains first and second rear processing racks 226A, 226B and a back end robot 228. Front end robot 218 is adapted to access processing modules in front end processing racks 220A, 220B; central robot 224 is adapted to access processing modules in front end processing racks 220A, 220B, first central processing rack 222A, second central processing rack 222B and/or rear processing racks 226A, 226B; and back end robot 228 is adapted to access processing modules in the rear processing racks 226A, 226B and in some cases exchange substrates with a stepper/scanner 5.

The stepper/scanner 5, which may be purchased from Canon USA, Inc. of San Jose, Calif., Nikon Precision Inc. of Belmont, Calif., or ASML US, Inc. of Tempe Ariz., is a lithographic projection apparatus used, for example, in the manufacture of integrated circuits (ICs). The scanner/stepper tool 5 exposes a photosensitive material (resist), deposited on the substrate in the cluster tool, to some form of electromagnetic radiation to generate a circuit pattern corresponding to an individual layer of the integrated circuit (IC) device to be formed on the substrate surface.

Each of the processing racks 220A, 220B; 222A, 222B and 226A, 226B contain multiple processing modules in a vertically stacked arrangement. That is, each of the processing racks may contain multiple stacked integrated thermal units 10, multiple stacked coater modules 232, multiple stacked coater/developer modules with shared dispense 234 or other modules that are adapted to perform the various processing steps required of a track photolithography tool. As examples, coater modules 232 may deposit a bottom antireflective coating (BARC); coater/developer modules 234 may be used to deposit and/or develop photoresist layers and integrated thermal units 10 may perform bake and chill operations associated with hardening BARC and/or photoresist layers.

In one embodiment, a system controller 240 is used to control all of the components and processes performed in the cluster tool 200. The controller 240 is generally adapted to communicate with the stepper/scanner 5, monitor and control aspects of the processes performed in the cluster tool 200, and is adapted to control all aspects of the complete substrate processing sequence. In some instances, controller 240 works in conjunction with other controllers, such as controllers 46A-46D, which control hot plate 20 and chill plate 30 of integrated thermal unit 10, to control certain aspects of the processing sequence. The controller 240, which is typically a microprocessor-based controller, is configured to receive inputs from a user and/or various sensors in one of the processing chambers and appropriately control the processing chamber components in accordance with the various inputs and software instructions retained in the controller's memory. The controller 240 generally contains memory and a CPU (not shown) which are utilized by the controller to retain various programs, process the programs, and execute the programs when necessary. The memory (not shown) is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits (not shown) are also connected to the CPU for supporting the processor in a conventional manner. The support circuits may include cache, power supplies, clock circuits, input/output circuitry, subsystems, and the like all well known in the art. A program (or computer instructions) readable by the controller 240 determines which tasks are performable in the processing chamber (s). Preferably, the program is software readable by the controller 240 and includes instructions to monitor and control the process based on defined rules and input data.

It is to be understood that embodiments of the invention are not limited to use with a track lithography tool such as that depicted in FIG. 14. Instead, embodiments of the invention may be used in any track lithography tool including the many different tool configurations described in U.S. application Ser. No. 11/112,281 entitled "Cluster Tool Architecture for Processing a Substrate" filed on Apr. 22, 2005, which is hereby incorporated by reference for all purposes and including configurations not described in the Ser. No. 11/112,281 application.

Figure 15:
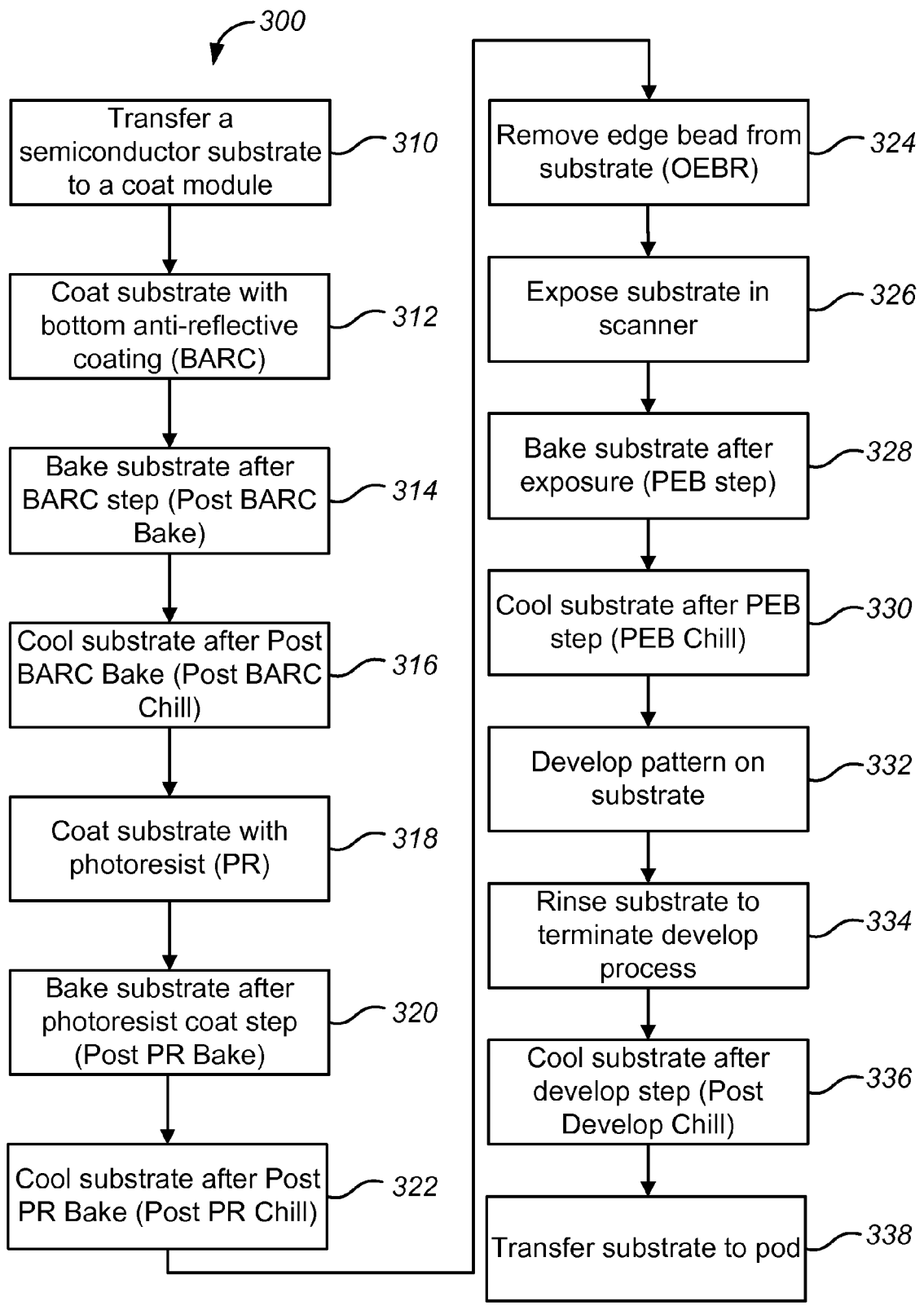
FIG. 15 is a flowchart illustrating an exemplary processing sequence for a semiconductor substrate processed by the track lithography tool shown in FIG. 14.

FIG. 15 is a flowchart illustrating an exemplary processing sequence for a semiconductor substrate processed within track lithography tool 200. A person of skill in the art will appreciate that the various process steps discussed below with respect to FIG. 15 present a number of different opportunities for the methods of the present inventions to be employed. The skilled artisan will also appreciate that various embodiments of the methods of the invention are not limited to the particular processing sequence set forth in FIG. 15 and can instead be used in any sequence of process steps or any application where it is desirable to exhibit a high degree of control over the thermal processing (and in particular complimentary bake and chill steps) of a plurality of substrates according to a particular process recipe.

FIG. 15 illustrates one embodiment of a series of method steps 300 that may be used to deposit, expose and develop a photoresist material layer formed on a substrate surface. The lithographic process may generally contain the following: a transfer substrate to coat module step 310, a bottom anti-reflective coating (BARC) coat step 312, a post BARC bake step 314, a post BARC chill step 316, a photoresist coat step 318, a post photoresist bake step 320, a post photoresist chill step 322, an optical edge bead removal (OEBR) step 324, an exposure step 326, a post exposure bake (PEB) step 328, a post exposure bake chill step 330, a develop step 332, a substrate rinse step 334, a post develop chill step 336 and a transfer substrate to pod step 338. In other embodiments, the sequence of the method steps 300 may be rearranged, altered, one or more steps may be removed, additional steps added or two or more steps may be combined into a single step without varying from the basic scope of the invention.

In step 310, a semiconductor substrate is transferred to a coat module. Referring to FIG. 14, the step of transferring the substrate to the coat module 310 is generally defined as the process of having front end robot 218 remove a substrate from a cassette 230 resting in one of the pod assemblies 216. A cassette 230, containing one or more substrates "W", is placed on the pod assembly 216 by the user or some external device (not shown) so that the substrates can be processed in the cluster tool 200 by a user-defined substrate processing sequence controlled by software retained in the system controller 240.

The BARC coat step 310 is a step used to deposit an organic material over a surface of the substrate. The BARC layer is typically an organic coating that is applied onto the substrate prior to the photoresist layer to absorb light that otherwise would be reflected from the surface of the substrate back into the resist during the exposure step 326 performed in the stepper/scanner 5. If these reflections are not prevented, standing waves will be established in the resist layer, which cause feature size to vary from one location to another depending on the local thickness of the resist layer. The BARC layer may also be used to level (or planarize) the substrate surface topography, which is generally present after completing multiple electronic device fabrication steps. The BARC material fills around and over the features to create a flatter surface for photoresist application and reduces local variations in resist thickness.

BARC coat step 310 is typically performed using a conventional spin-on resist dispense process in which an amount of the BARC material is deposited on the surface of the substrate while the substrate is being rotated which causes a solvent in the BARC material to evaporate and thus causes the material properties of the deposited BARC material to change. The air flow and exhaust flow rate in the BARC processing chamber is often controlled to control the solvent vaporization process and the properties of the layer formed on the substrate surface.

Post BARC bake step 314, is a step used to assure that all of the solvent is removed from the deposited BARC layer in BARC coat step 312, and in some cases to promote adhesion of the BARC layer to the surface of the substrate. The temperature of post BARC bake step 314 is dependent on the type of BARC material deposited on the surface of the substrate, but will generally be less than about 250° C. The time required to complete post BARC bake step 314 will depend on the temperature of the substrate during the post BARC bake step, but will generally be less than about 60 seconds.

Post BARC chill step 316, is a step used to control and assure that the time the substrate is above ambient temperature is consistent so that every substrate sees the same time-temperature profile and thus process variability is minimized. Variations in the BARC process time-temperature profile, which is a component of a substrates wafer history, can have an effect on the properties of the deposited film layer and thus is often controlled to minimize process variability. Post BARC chill step 316, is typically used to cool the substrate after post BARC bake step 314 to a temperature at or near ambient temperature. The time required to complete post BARC chill step 316 will depend on the temperature of the substrate exiting the post BARC bake step, but will generally be less than about 30 seconds.

Photoresist coat step 318, is a step used to deposit a photoresist layer over a surface of the substrate. The photoresist layer deposited during the photoresist coat step 318 is typically a light sensitive organic coating that are applied onto the substrate and is later exposed in the stepper/scanner 5 to form the patterned features on the surface of the substrate. Photoresist coat step 318 is a typically performed using conventional spin-on resist dispense process in which an amount of the photoresist material is deposited on the surface of the substrate while the substrate is being rotated which causes a solvent in the photoresist material to evaporate and thus causes the material properties of the deposited photoresist layer to change. The air flow and exhaust flow rate in the photoresist processing chamber is controlled to control the solvent vaporization process and the properties of the layer formed on the substrate surface. In some cases it may be necessary to control the partial pressure of the solvent over the substrate surface to control the vaporization of the solvent from the resist during the photoresist coat step by controlling the exhaust flow rate and/or by injecting a solvent near the substrate surface. Referring to FIG. 14, in an exemplary photoresist coating process, the substrate is first positioned on a wafer chuck in coater/developer module 234. A motor rotates the wafer chuck and substrate while the photoresist is dispensed onto the center of the substrate. The rotation imparts an angular torque onto the photoresist, which forces the photoresist out in a radial direction, to ultimately covering the substrate.

Photoresist bake step 320, is a step used to assure that all of the solvent is removed from the deposited photoresist layer in photoresist coat step 318, and in some cases to promote adhesion of the photoresist layer to the BARC layer. The temperature of post photoresist bake step 320 is dependent on the type of photoresist material deposited on the surface of the substrate, but will generally be less than about 350° C. The time required to complete post photoresist bake step 320 will depend on the temperature of the substrate during the post photoresist bake step, but will generally be less than about 60 seconds.

Post photoresist chill step 322, is a step used to control the time the substrate is at a temperature above ambient temperature so that every substrate sees the same time-temperature profile and thus process variability is minimized. Variations in the time-temperature profile can have an effect on properties of the deposited film layer and thus is often controlled to minimize process variability. The temperature of post photoresist chill step 322, is thus used to cool the substrate after post photoresist bake step 320 to a temperature at or near ambient temperature. The time required to complete post photoresist chill step 322 will depend on the temperature of the substrate exiting the post photoresist bake step, but will generally be less than about 30 seconds.

Optical edge bead removal (OEBR) step 324, is a process used to expose the deposited light sensitive photoresist layer (s), such as, the layers formed during photoresist coat step 318 and the BARC layer formed during BARC coat step 312, to a radiation source (not shown) so that either or both layers can be removed from the edge of the substrate and the edge exclusion of the deposited layers can be more uniformly controlled. The wavelength and intensity of the radiation used to expose the surface of the substrate will depend on the type of BARC and photoresist layers deposited on the surface of the substrate. An OEBR tool can be purchased, for example, from USHIO America, Inc. Cypress, Calif.

Exposure step 326, is a lithographic projection step applied by a lithographic projection apparatus (e.g., stepper scanner 5) to form a pattern which is used to manufacture integrated circuits (ICs). The exposure step 326 forms a circuit pattern corresponding to an individual layer of the integrated circuit (IC) device on the substrate surface, by exposing the photosensitive materials, such as, the photoresist layer formed during photoresist coat step 318 and the BARC layer formed during the BARC coat step 312 of some form of electromagnetic radiation.

Post exposure bake (PEB) step 328, is a step used to heat a substrate immediately after exposure step 326 in order to stimulate diffusion of the photoactive compound(s) and reduce the effects of standing waves in the resist layer. For a chemically amplified resist, the PEB step also causes a catalyzed chemical reaction that changes the solubility of the resist. The control of the temperature during the PEB is typically critical to critical dimension (CD) control. The temperature of PEB step 328 is dependent on the type of photoresist material deposited on the surface of the substrate, but will generally be less than about 250° C. The time required to complete PEB step 328 will depend on the temperature of the substrate during the PEB step, but will generally be less than about 60 seconds.

Post exposure bake (PEB) chill step 330, is a step used to control the assure that the time the substrate is at a temperature above ambient temperature is controlled so that every substrate sees the same time-temperature profile and thus process variability is minimized. Variations in the PEB process time-temperature profile can have an effect on properties of the deposited film layer and thus is often controlled to minimize process variability. The temperature of PEB chill step 330, is thus used to cool the substrate after PEB step 328 to a temperature at or near ambient temperature. The time required to complete PEB chill step 330 will depend on the temperature of the substrate exiting the PEB step, but will generally be less than about 30 seconds.

Develop step 332, is a process in which a solvent is used to cause a chemical or physical change to the exposed or unexposed photoresist and BARC layers to expose the pattern formed during exposure process step 326. The develop process may be a spray or immersion or puddle type process that is used to dispense the developer solvent. In some develop processes, the substrate is coated with a fluid layer, typically deionized water, prior to application of the developer solution and spun during the development process. Subsequent application of the developer solution results in uniform coating of the developer on the substrate surface. In step 334, a rinse solution is provided to surface of the substrate, terminating the develop process. Merely by way of example, the rinse solution may be deionized water. In alternative embodiments, a rinse solution of deionized water combined with a surfactant is provided. One of ordinary skill in the art would recognize many variations, modifications, and alternatives.

In step 336, the substrate is cooled after the develop and rinse stets 332 and 334. In step 338, the substrate is transferred to the pod, thus completing the processing sequence. Transferring the substrate to the pod in step 338 generally entails the process of having the front end robot 218 return the substrate to a cassette 230 resting in one of the pod assemblies 216.

Based on the description of the present invention herein, a person of skill in the art will appreciate that embodiments of the invention may be beneficially used to heat and/or cool a substrate during, among other steps not described in FIG. 15, post BARC bake step 314 and post BARC chill step 316, during post PR bake step 320 and post PR chill step 322, during post exposure bake step 328 and post exposure chill step 330 and during post develop chill step 336. A skilled artisan will also appreciate some of the various bake and chill sequences set just described have differing bake and or chill requirements. Thus, the skilled artisan will appreciate that the functional specifications of a particular bake plate 20 and/or chill plate 30 incorporated into the integrated thermal unit will depend on the material the bake and/or chill plate are intended to heat and cool, respectively. For example, BARC materials may be adequately heated with a low temperature, low precision bake plate (e.g., a maximum 250° C., single zone heater) while photoresist materials may require a high temperature, mid-precision bake plate (e.g., a maximum 350° C., three zone heater) and the post exposure bake process may require a low temperature, high precision bake plate (e.g., a maximum 250° C., fifteen zone heater). Thus, embodiments of the invention are not limited to any particular type of or configuration of bake plate 20 or chill plate 30. Instead, generally each of bake plate 20 and chill plate 30 is designed to particular performance standards as required by the application for which the bake plate and chill plate will be used as can be determined by a person of skill in the art.

While the present invention has been described with respect to particular embodiments and specific examples thereof, it should be understood that other embodiments may fall within the spirit and scope of the invention. The scope of the invention should, therefore, be determined with reference to the appended claims along with their full scope of equivalents.

What is claimed is:

1. An integrated thermal unit for processing a substrate in a track lithography tool, the integrated thermal unit comprising:
   a housing vertically stacked on a second housing, both the housing and the second housing being disposed in the track lithography tool;
   a hot station disposed in the housing, the hot station comprising a bake plate configured to hold and heat a substrate;
   a chill station disposed in the housing, the chill station comprising a chill plate configured to hold and cool the substrate;
   a substrate transfer shuttle disposed in the housing, the substrate transfer shuttle configured to transfer the substrate from the bake plate to the chill plate along a path within the housing; and
   a shuttle station disposed in the housing, wherein the substrate can be transferred into the housing at the shuttle station and picked up by the substrate transfer shuttle.

2. The integrated thermal unit of claim 1 further comprising one or more cooling channels coupled to the housing.

3. The integrated thermal unit of claim 2 wherein the cooling channel is coupled to a top portion of the housing.

4. The integrated thermal unit of claim 3 further comprising a second cooling channel coupled to a bottom portion of the housing.

5. The integrated thermal unit of claim 2 wherein the cooling channels are configured to receive a flow of a cooling fluid.

6. The integrated thermal unit of claim 5 wherein the cooling fluid comprises de-ionized water.

7. The integrated thermal unit of claim 1 wherein the housing is characterized by a depth approximately equal to a diameter of the substrate.

8. The integrated thermal unit of claim 7 wherein the housing is further characterized by a width approximately equal to three times the diameter of the substrate.

9. The integrated thermal unit of claim 1 wherein the bake plate comprises a plurality of proximity pins embedded in a top surface of the bake plate and rising to a first height above the top surface of the bake plate.

10. The integrated thermal unit of claim 1 wherein the bake plate comprises a plurality of heater zones.

11. The integrated thermal unit of claim 1 wherein the housing forms a substantially rectangular enclosure and the bake station, chill station and shuttle station are arranged linearly along a length of the enclosure.

12. The integrated thermal unit set forth in claim 11 wherein the shuttle station is positioned between the bake station and the chill station.

13. The integrated thermal unit set forth in claim 11 wherein the chill station is positioned between the bake station and the shuttle station.

14. A track lithography tool comprising:
- a plurality of pod assemblies adapted to accept one or more cassettes of substrates;
- a plurality of processing modules adapted to perform various processing steps associated with the track lithography tool, the plurality of processing modules including at least one module for coating a wafer with photoresist, at least one module for developing the photoresist and two or more integrated thermal units vertically stacked inside the track lithography tool, each of the integrated thermal units including: (i) a housing containing a hot station, a chill station, and a shuttle station; (ii) the hot station comprising a bake plate configured to hold and heat a substrate; (iii) the chill station comprising a chill plate configured to hold and cool a substrate; and (iv) the shuttle station at which a substrate transfer shuttle is stationed, the substrate transfer shuttle being configured to transfer substrates from the bake plate to the chill plate; and
- one or more robots adapted to transfer the substrates from the one or more pod assemblies to selected processing modules within the track lithography tool or transfer the substrates between the selected processing modules.

15. The track lithography tool of claim 14 further comprising one or more cooling channels coupled to the housing.

16. The track lithography tool of claim 15 wherein the cooling channel is coupled to a bottom portion of the housing.

17. The track lithography tool of claim 16 further comprising a second cooling channel coupled to a top portion of the housing.

18. The track lithography tool of claim 14 wherein the cooling channels are configured to receive a flow of a cooling fluid.

19. The track lithography tool of claim 18 wherein the cooling fluid comprises de-ionized water.

20. The track lithography tool of claim 14 wherein the substrate transfer shuttle is configured to transfer the substrates from the bake plate to the chill plate along a horizontally linear path within the housing.

* * * * *